US007413844B2

(12) United States Patent
Matsuura et al.

(10) Patent No.: US 7,413,844 B2
(45) Date of Patent: Aug. 19, 2008

(54) LITHOGRAPHIC PRINTING PLATE SUPPORT AND METHOD OF MANUFACTURING THE SAME

(75) Inventors: Atsushi Matsuura, Shizuoka (JP); Hirokazu Sawada, Shizuoka (JP); Akio Uesugi, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 11/377,546

(22) Filed: Mar. 17, 2006

(65) Prior Publication Data

US 2006/0210927 A1 Sep. 21, 2006

(30) Foreign Application Priority Data

Mar. 17, 2005 (JP) ............................. 2005-077599

(51) Int. Cl.
*G03F 7/00* (2006.01)
*C25D 5/44* (2006.01)

(52) U.S. Cl. ........................ 430/302; 205/213; 205/214

(58) Field of Classification Search .............. 430/270.1, 430/278.1, 302; 205/213, 214
See application file for complete search history.

(56) References Cited

U.S. PATENT DOCUMENTS

| | | | | |
|---|---|---|---|---|
| 7,048,988 | B2 * | 5/2006 | Sawada et al. | 428/141 |
| 2003/0165768 | A1 | 9/2003 | Hotta et al. | |
| 2004/0079252 | A1 | 4/2004 | Sawada et al. | |
| 2005/0118452 | A1 * | 6/2005 | Nishino et al. | 428/667 |
| 2006/0040212 | A1 * | 2/2006 | Matsuura et al. | 430/300 |
| 2006/0223005 | A1 * | 10/2006 | Hotta | 430/300 |

FOREIGN PATENT DOCUMENTS

| | | | |
|---|---|---|---|
| EP | 1 300 257 | A2 * | 4/2003 |
| EP | 1 396 348 | A2 * | 3/2004 |
| JP | 2003-1963 | A | 1/2003 |
| JP | 2003-112484 | A | 4/2003 |
| JP | 2004-148798 | A | 5/2004 |

* cited by examiner

*Primary Examiner*—Amanda C. Walke
(74) *Attorney, Agent, or Firm*—Sughrue Mion, PLLC

(57) ABSTRACT

A lithographic printing plate support capable of obtaining a presensitized plate which is excellent in scumming resistance and scratch resistance and achieves a good balance between sensitivity and press life, and a method of manufacturing the support are provided. The support includes a surface which has an arithmetic mean roughness $R_a$ of 0.36 to 0.50 μm; not more than 3.0 recesses with a depth of at least 4 μm per 400 μm square region; and a surface area ratio $\Delta S^{5(0.02-0.2)}$ determined from $S_x^{5(0.02-0.2)}$ denoting the actual surface area of a 5 μm square surface region as determined by three-point approximation based on data obtained by extracting 0.02 to 0.2 μm wavelength components from three-dimensional data on the surface region measured with an atomic force microscope at 512×512 points and $S_0$ denoting the geometrically measured surface area of the surface region, of 50 to 90%.

5 Claims, 3 Drawing Sheets

LITHOGRAPHIC PRINTING PLATE SUPPORT AND METHOD OF MANUFACTURING THE SAME

The entire contents of literatures cited in this specification are incorporated herein by reference.

BACKGROUND OF THE INVENTION

The present invention relates to a lithographic printing plate support and a method of manufacturing the same. More specifically, the invention relates to a lithographic printing plate support capable of obtaining a presensitized plate for lithographic printing which is excellent in scratch resistance and achieves a good balance between sensitivity and press life, and a method of manufacturing the same.

Lithographic printing is a process that makes use of the inherent immiscibility of water and oil. Lithographic printing plates used in lithographic printing have formed on a surface thereof regions which are receptive to water and repel oil-based inks (referred to below as "non-image areas") and regions which repel water and are receptive to oil-based inks (referred to below as "image areas").

The surface of the aluminum support employed in a lithographic printing plate (referred to below simply as a "lithographic printing plate support") is used to carry non-image areas, and must therefore have a number of conflicting properties, including, on the one hand, excellent hydrophilicity and water retentivity and, on the other hand, excellent adhesion to the image recording layer that is formed thereon. If the surface of the lithographic printing plate support is not hydrophilic enough, ink will adhere to non-image areas during printing, causing ink buildup on the blanket cylinder and, in turn, scumming. That is, the scumming resistance of the plate will worsen.

Scratch-like dropouts occur on an image due to striking of a presensitized plate against something when it is handled, slight rubbing of the presensitized plate against interleaving paper, or slight touching as touching a plate surface by a finger, and hence its handling during the plate making operation is now difficult. In order to enhance the scratch resistance, attempts have been made to lower the coefficient of friction by forming a layer made of a fluorochemical surfactant or a waxing compound on the surface of a recording layer. However, a satisfactory solution has not been obtained yet.

The smoother the surface of the lithographic printing plate support is, the smoother the recording layer formed thereon is, hence the more excellent the resulting lithographic printing plate is in scratch resistance. However, if the surface of the lithographic printing plate support is too smooth, adhesion of the lithographic printing plate support to the recording layer is impaired, which readily causes the recording layer to come off, thus leading to deterioration of the durability (press life) when a large number of impressions are made.

When locally deep recesses are formed on the surface of a lithographic printing plate support, a lithographic printing plate having a positive-type image recording layer formed on the support has a problem that locally deep portions in non-image areas are not readily developed, whereas a lithographic printing plate having a negative-type image recording layer formed on the support has a problem that image is not readily formed in locally deep portions of image areas, leading to lowering of the sensitivity.

In order to enhance various performance characteristics such as scumming resistance, scratch resistance, sensitivity and press life, asperities are formed on the surface of the lithographic printing plate support through various surface graining treatments.

JP 2003-112484 A (the term "JP XXXX-XXXXXX A" as used herein means an "unexamined published Japanese patent application") describes a lithographic printing plate support which is obtained by subjecting an aluminum plate to graining treatment and anodizing treatment and which has on the surface thereof a grained shape of a structure in which a small wave structure having an average aperture diameter of 0.01 to 0.2 μm is superposed on a medium wave structure having an average aperture diameter of 0.5 to 5 μm. JP 2003-112484 A also describes that the lithographic printing plate obtained is excellent in press life and scumming resistance.

JP 2003-1963 A describes a method of obtaining a presensitized plate for use in laser plate making which is excellent in press life and does not cause scumming on the blanket cylinder or printing paper, the method using a lithographic printing plate support obtained by subjecting an aluminum plate to mechanical graining treatment in which the aluminum plate is scrubbed with rotating brushes while abrasive particles having a mean particle size of 5 to 70 μm and containing at least 60% by mass of $SiO_2$ are supplied thereto; etching treatment; and electrolytic graining treatment in which the aluminum plate is electrolyzed in an acidic electrolyte solution.

JP 2004-148798 A describes a lithographic printing plate support which has a surface area ratio $\Delta S^{50}$ defined by formula (11):

$$\Delta S^{50}(\%)=[(S_x^{50}-S_0)/S_0]\times 100(\%) \quad (11)$$

wherein $S_x^{50}$ is the actual surface area of a 50 μm square surface region as determined by three-point approximation from three-dimensional data on the surface region measured with an atomic force microscope at 512×512 points and $S_0$ is the geometrically measured surface area of the same surface region, of 50 to 90%, and which has a steepness a $45^{50(0.02\text{-}0.2)}$, defined as the surface area percentage represented by areas where the slope is 45° or more in the data obtained by extracting the 0.02 to 0.2 μm wavelength components from the above three-dimensional data, of 5 to 40%.

SUMMARY OF THE INVENTION

Lithographic printing plates manufactured using lithographic printing plate supports such as those described in the above documents have both a long press life and a good scumming resistance.

However, the inventors of the present invention have found that the conventionally manufactured lithographic printing plates have considerable room for improvement in the scratch resistance and further enhancement of the balance between the sensitivity and press life without impairing their scumming resistance.

It is therefore an object of the invention to provide a lithographic printing plate support capable of obtaining a presensitized plate which is excellent in scumming resistance and scratch resistance and achieves a good balance between sensitivity and press life. Another object of the invention is to provide a method of manufacturing the lithographic printing plate support.

The inventors of the present invention have made extensive studies on the surface profile of lithographic printing plate supports to achieve the above objects and, as a result, found that when the arithmetic mean roughness $R_a$ as a factor indicating the surface profile is kept at a relatively high level, the number of recesses having a depth of 4 μm or more is set to be not more than a predetermined value, and the surface area ratio $\Delta S^{5(0.20\text{-}0.2)}$ determined with an atomic force microscope is set to fall within a specified range, presensitized plates manufactured using the resulting lithographic printing plate supports have both an excellent scumming resistance and an excellent scratch resistance, and achieve a good balance between sensitivity and press life. The present invention has been completed based on the finding.

Accordingly, the invention provides the following aspects (1) to (4).

(1) A lithographic printing plate support comprising a surface which has:

an arithmetic mean roughness $R_a$ of 0.36 to 0.50 μm;

not more than 3.0 recesses with a depth of at least 4 μm per 400 μm square region; and a surface area ratio $\Delta S^{5(0.02\text{-}0.2)}$ defined by formula (1):

$$\Delta S^{5(0.02\text{-}0.0.2)}(\%)=[(S_x^{5(0.02\text{-}0.2)}-S_0)/S_0]\times 100(\%) \quad (1)$$

wherein $\Delta S^{5(0.02\text{-}0.2)}$ is the actual surface area of a 5 μm square surface region as determined by three-point approximation based on data obtained by extracting 0.02 to 0.2 μm wavelength components from three-dimensional data on the surface region measured with an atomic force microscope at 512×512 points and $S_0$ is the geometrically measured surface area of the surface region, of 50 to 90%.

(2) A presensitized plate comprising a lithographic printing plate support according to (1) and a recording layer formed on the lithographic printing plate support and having a weight per unit area of 1.1 to 1.6 g/m$^2$.

The lithographic printing plate support and the presensitized plate are preferably manufactured by the methods described below.

(3) A manufacturing method comprising the steps of:

subjecting an aluminum plate at least to a first electrochemical graining treatment in a nitric acid-containing aqueous solution and a second electrochemical graining treatment in a hydrochloric acid-containing aqueous solution; and bringing the aluminum plate having undergone the first and second electrochemical graining treatments into contact with an alkaline aqueous solution to carry out alkaline etching treatment until the amount of a material removed by the alkaline etching treatment reaches 0.01 to 0.08 g/dm$^2$.

(4) A manufacturing method comprising the step of carrying out mechanical graining treatment by scrubbing an aluminum plate with rotating brushes while an abrasive having a mean particle size of 5 to 40 μm and containing at least 60 wt % of $SiO_2$ is supplied to the aluminum plate.

As will become clear from the following description, the present invention provides a lithographic printing plate support capable of obtaining a presensitized plate which is excellent in scratch resistance and achieves a good balance between sensitivity and press life, and a method of manufacturing such a lithographic printing plate support.

DETAILED DESCRIPTION OF THE INVENTION

Figure 1:
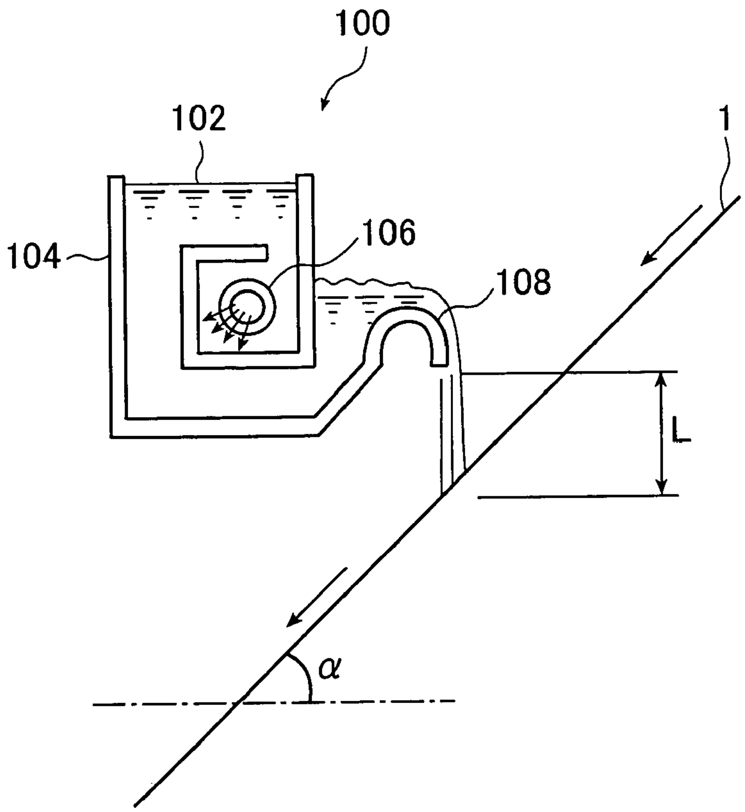
FIG. 1 is a schematic cross-sectional view of an apparatus which carries out rinsing with a free-falling curtain of water that is used for rinsing in the method of manufacturing a lithographic printing plate support according to the present invention.

The surface of the inventive lithographic printing plate support has an arithmetic mean roughness $R_a$ of 0.36 to 0.50 μm, not more than 3.0 recesses with a depth of at least 4 μm per 400 μm square region, and a surface area ratio $\Delta S^{5(0.02\text{-}0.2)}$ defined by formula (1) below of 50 to 90%.

$$\Delta S^{5(0.02\text{-}0.2)}(\%)=[(S_x^{5(0.02\text{-}0.2)}-S_0)/S_0]\times 100(\%) \quad (1)$$

The arithmetic mean roughness $R_a$ of the surface of the lithographic printing plate support is a factor indicating un uneven profile including large undulations on the surface thereof.

The lithographic printing plate support of the present invention has an arithmetic mean roughness $R_a$ of 0.36 to 0.50 μm, preferably 0.36 to 0.45 μm and more preferably 0.36 to 0.42 μm. A lithographic printing plate support whose arithmetic mean roughness $R_a$ falls within the range of as relatively large as 0.36 to 0.45 μm and which has the properties such as scumming resistance, scratch resistance and good balance between sensitivity and press life in combination allows a presensitized plate to be excellent in scumming resistance and scratch resistance and to achieve a good balance between sensitivity and press life.

It is not known why the presensitized plate is excellent in scratch resistance, but it seems that when the arithmetic mean roughness of the support falls within a predetermined range, the surface of the recording layer formed on the support has a specified uniform roughness, hence there is a high possibility that the surface of the recording layer has not a linear or planar contact but a point contact when the presensitized plate is struck against something during its handling or rubs against interleaving paper.

The surface of the lithographic printing plate support of the present invention has not more than 3.0 recesses with a depth of at least 4 μm per 400 μm square region.

When the number of the recesses falls within the above range, a lithographic printing plate having a positive-type image recording layer formed on the support does not have a problem of a film remaining in a spotty manner and a lithographic printing plate having a negative-type image recording layer formed on the support does not have a problem of spotty dropouts. In other words, a lithographic printing plate which is excellent in sensitivity is obtained.

The number of recesses with a depth of at least 4 μm is preferably not more than 2.5 and more preferably not more than 1.5 per 400 μm square region.

$S_x^{5(0.02\text{-}0.2)}$ is the actual surface area of a 5 μm square region of the surface of the support as determined by three-point approximation based on data obtained by extracting the 0.02 to 0.2 μm wavelength components from three-dimensional data on the surface region measured with an atomic force microscope at 512×512 points, and $S_0$ is the geometrically measured surface area of the same 5 μm square surface region. The surface area ratio $\Delta S^{5(0.02\text{-}0.2)}$ is a factor which indicates the degree of increase in the actual surface area $S_x^{5(0.02\text{-}0.2)}$ relative to the geometrically measured surface area $S_0$.

The lithographic printing plate support of the invention has a surface area ratio $\Delta S^{5(0.02\text{-}0.2)}$ of 50 to 90%, preferably 60 to 90%, and more preferably 60 to 80%.

At a surface area ratio $\Delta S^{5(0.02\text{-}0.2)}$ in the above range, when the presensitized plate is fabricated, the surface area of contact with the subsequently described recording layer is sufficiently large to provide a good adhesion to the recording layer, resulting in an excellent durability (press life) when a large number of impressions are made.

Measurement Method (1) Arithmetic Mean Roughness $R_a$

Two-dimensional surface roughness measurement is carried out using a stylus-type surface roughness tester (e.g., Surfcom 575, available from Tokyo Seimitsu Co., Ltd.) to determine the arithmetic mean roughness $R_a$ as defined in ISO 4287.

The arithmetic mean roughness $R_a$ is the value obtained from formula (2) below for a segment of the roughness curve having a reference length l sampled in the direction of the mean line. Here, the x-axis is oriented in the direction of the sampled segment, the y-axis is oriented in the direction of the longitudinal magnification, and the roughness curve is expressed as y=f(x).

$$R_a = \frac{1}{l}\int_0^{l} |f(x)|\,dx \tag{2}$$

Conditions for measuring the two-dimensional roughness are shown below.

Measurement Conditions

Cutoff value, 0.8 mm; slope correction, FLAT-ML; measurement length, 3 mm; longitudinal magnification, 10,000×; scan rate, 0.3 mm/s; stylus tip diameter, 2 μm.

(2) Number of Recesses with a Depth of at Least 4 μm

A laser microscope (e.g., Micromap 520 manufactured by Ryoka Systems Inc.) was used to scan a 400 μm square region on the surface of the support in a non-contact state with a resolution of 0.01 μm to determine three-dimensional data. The number of recesses with a depth of at least 4 μm is counted in the three-dimensional data to obtain the number of recesses.

(3) Surface Area Ratio $\Delta S^{5(0.02\text{-}0.2)}$ (i) Measurement of Surface Profile Using Atomic Force Microscope:

First, the surface profile is measured with an atomic force microscope (AFM) and three-dimensional data f(x,y) is determined.

Measurement can be carried out under the following conditions. A 1 cm square sample is cut out from the lithographic printing plate support and placed on a horizontal sample holder mounted on a piezo scanner. A cantilever is then made to approach the surface of the sample. When the cantilever reaches the zone where interatomic forces are appreciable, the surface of the sample is scanned in the X and Y directions, and the surface topography of the sample is read based on the displacement in the Z direction. A piezo scanner capable of scanning 150 μm in the X and Y directions and 10 μm in the Z direction is used. A cantilever having a resonance frequency of 120 to 400 kHz and a spring constant of 12 to 90 N/m (e.g., SI-DF20 or SI-DF40, manufactured by Seiko Instruments Inc.; NCH, manufactured by Nanosensors; or AC-160TS, manufactured by Olympus Corporation) is used, with measurement being carried out in the dynamic force mode (DFM). The three-dimensional data obtained is approximated by the least-squares method to compensate for slight tilting of the sample and determine a reference plane.

Measurement involves obtaining values of 5 μm square regions on the surface of the sample at 512 by 512 points. The resolution is 0.01 μm in the X and Y directions, and 0.15 nm in the Z direction. The scan rate is 5 μm/s.

(ii) Correction of Three-Dimensional Data

Next, components having a wavelength in the range of 0.02 to 0.2 μm are extracted from the three-dimensional data f(x,y) based on the measurement of the 5 μm square surface region obtained in (i) above. More specifically, these components are extracted by performing a fast Fourier transform on the three-dimensional data f(x,y) obtained in (i) to determine a frequency distribution, removing components having a wavelength of less than 0.02 μm and those having a wavelength exceeding 0.2 μm, and performing an inverse Fourier transform. Three-dimensional data obtained by correction is referred to as g(x,y) below.

(iii) Calculation of Surface Area Ratio $\Delta S^{5(0.02\text{-}0.2)}$

Next, using the three-dimensional data g(x,y) obtained by correction in (ii) above, sets of adjacent three points are selected and the surface areas of microtriangles formed by the sets of three points are summated, thereby giving the actual surface area $S_x^{5(0.02\text{-}0.2)}$. The surface area ratio $\Delta S^{5(0.02\text{-}0.2)}$ is then calculated from the resulting actual surface area $S_x^{5(0.02\text{-}0.2)}$ and the geometrically measured surface area $S_0$ using formula (1) above.

Lithographic Printing Plate Support

Next, a specific method for manufacturing the inventive lithographic printing plate support is described.

Surface Treatment

The lithographic printing plate support of the invention, while not subject to any particular limitation in its manufacturing method, may be obtained by, for example, subjecting the subsequently described aluminum plate to at least 1) mechanical graining treatment; or
2) graining treatment for transferring recesses and protrusions of the roll surface onto the plate surface by bringing the roll surface into pressure contact with the plate surface, or
3) electrochemical graining treatment which is carried out in a hydrochloric acid-based aqueous solution using electricity in an amount of at least 150 C/dm$^2$.

After any of the above graining treatments 1) to 3) (hereinafter often generically referred to as "large wave-forming method"), the following treatments may be carried out in the order indicated: Electrochemical graining treatment in which an alternating current is passed through the aluminum plate in an acid-containing aqueous solution (referred to below as "first electrochemical graining treatment"), etching treatment in an alkaline aqueous solution ("second etching treatment"), electrochemical graining treatment in which an alternating current is passed through the aluminum plate in an acid-containing aqueous solution ("second electrochemical graining treatment"), and etching treatment in an alkaline aqueous solution ("third etching treatment").

The acid used in the first electrochemical graining treatment is preferably nitric acid, and the acid used in the second electrochemical graining treatment is preferably hydrochloric acid.

In the third etching treatment, the amount of material removed by etching (also referred to below as the "etching amount") is preferably 0.01 to 0.08 $g/dm^2$, more preferably 0.03 to 0.06 $g/dm^2$, and even more preferably 0.03 to 0.05 $g/dm^2$. When the etching amount falls within the above ranges, effective use can be made of the profile of the small wave structure formed by hydrochloric acid electrolysis, which further enhances the scumming resistance and scratch resistance.

In the second electrochemical graining treatment, the current is passed through the aluminum plate in such a way that the total amount of electricity when the aluminum plate serves as an anode is preferably at least 20 $C/dm^2$, more preferably 20 to 100 $C/dm^2$, and even more preferably 30 to 70 $C/dm^2$.

Manufacture of the inventive lithographic printing plate support may include various other steps in addition to the above.

For example, after the large wave-forming method has been carried out, the aluminum plate may be subjected to, in order: etching treatment in an alkaline aqueous solution (referred to below as "first etching treatment"), desmutting treatment in an acidic aqueous solution ("first desmutting treatment"), first electrochemical graining treatment, second etching treatment, desmutting treatment in an acidic aqueous solution ("second desmutting treatment"), second electrochemical graining treatment, third etching treatment, desmutting treatment in an acidic aqueous solution ("third desmutting treatment"), and anodizing treatment.

After the above anodizing treatment, it is advantageous to additionally carry out sealing treatment, hydrophilizing treatment, or sealing treatment followed by hydrophilizing treatment.

The respective surface treatment steps will be described below in detail.

Large Wave-Forming Method

1) Mechanical Graining Treatment

Mechanical graining treatment is not limited to any particular type, as long as a graining treatment using an abrasive and brushes is adopted. The mechanical graining treatment described below is preferably carried out.

At least one surface of an aluminum plate is scrubbed with rotating brushes while being supplied with abrasive particles which are based on $SiO_2$ particles and whose mean particle size and particle size distribution fall within specified ranges, respectively. The abrasive particles to be used in mechanical graining treatment have preferably a mean particle size of 5 to 50 μm, more preferably 10 to 40 μm, and even more preferably 23 to 35 μm. The $SiO_2$ content in the abrasive particles is desirably at least 60 wt %. The $SiO_2$ content is preferably 65 to 98 wt % and more preferably 70 to 95 wt % in consideration of the hardness and availability. Examples of the abrasive particles that may be used include pumice ($SiO_2$ content: 73 wt %) and silica sand ($SiO_2$ content: 95 wt %). Commercial products such as pumice (available from PUMEX) and silica sand (available from Sanei Silica Co., Ltd.) can be used for the abrasive particles. Use of pumice is particularly preferred in the present invention.

When the abrasive particles described above are used in the mechanical graining treatment step, abrasive particles do not bite into the surface of an aluminum web, nor is the surface of the aluminum web eroded by abrasive particles having a large particle size. Therefore, a large scratch that may cause scumming on the blanket cylinder of an offset printing press and on printing paper is not formed on the surface of the support.

The abrasive particles can be used, for example, in the form of slurry. An example of the slurry includes a suspension of about 5 to 50 wt % of the abrasive particles in water. The suspension may also include a thickener, a dispersant such as a surfactant, and an antiseptic.

Mechanical graining treatment can be carried out by using a graining device having such rotating brushes as roller brushes in which a large number of brush bristles are implanted in a cylindrical body.

Figure 5:
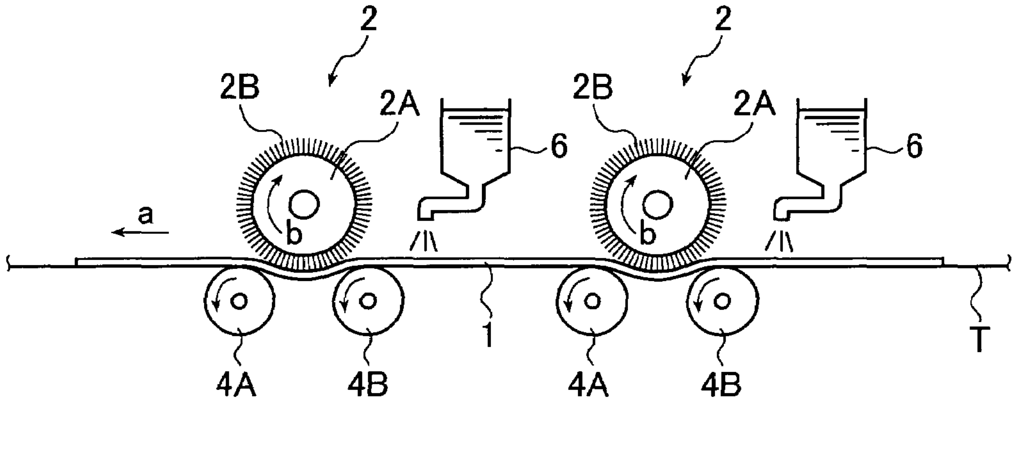
FIG. 5 is a side view conceptually showing processes of mechanical graining treatment in the method of manufacturing a lithographic printing plate support according to the present invention.

An example of the graining device is the one as shown in FIG. 5 which includes two roller brushes 2 provided above the transport surface T that is a virtual surface along the transport path of an aluminum plate 1 in the present invention and two pairs of support rollers 4A and 4B provided for the respective roller brushes 2 on the opposite side to the transport surface T. The support rollers 4A are provided downstream of the roller brushes 2 in the transport direction (indicated by an arrow a in FIG. 5) and the support rollers 4B are provided upstream of the roller brushes 2 in the transport direction a.

In the graining device, abrasive slurry-supplying tanks 6 for supplying slurry containing the abrasive particles are further provided above the transport surface T upstream of the respective roller brushes 2.

In the graining device, the number of sets of the roller brushes 2 and the pairs of the support rollers 4A and 4B are not limited to two. For the graining device, only one set of the roller brush 2 and the pair of the support rollers 4A and 4B may be used, or three or more sets of the roller brushes 2 and the pairs of the support rollers 4A and 4B may be used instead. In the former case, one abrasive slurry-supplying tank 6 is provided upstream of the roller brush 2. In the latter case, one abrasive slurry-supplying tank 6 is provided for each of the sets.

A core-type brush roller including a body 2A which has an axis parallel to the transport surface T and perpendicular to the transport direction a, and brush bristles 2B implanted in the outer periphery of the body 2A so as to extend radially outward from the body 2A.

Each of the brush bristles 2B has preferably a diameter of 0.15 to 1.35 mm and a length of 10 to 100 mm. The brush bristles 2B are preferably implanted in the body 2A at a density of 30 to 5,000 $bristles/cm^2$. Use of the roller brushes each having the brush bristles 2B whose diameter and implantation density fall within the above ranges prevents large and nonuniform scratches that may cause scumming on the blanket cylinder from being formed on the surface of the aluminum plate during mechanical graining treatment.

Synthetic resin bristles made of synthetic resins such as nylon, polypropylene and polyvinyl chloride, bristles made of animal hairs such as cow hair, pig hair and horse hair, and bristles made of natural fibers such as wool can be used for the brush bristles 2B.

The brush bristles 2B may be formed by separately implanting bristles in the body 2A or implanting bundles of multiple bristles, for example, 10 to 5,000 bristles in the body 2A.

The roller brushes 2 preferably rotate at a speed of about 100 to about 1,000 rpm. The rotation direction b of the roller brush 2 in the portion where the surface of the aluminum web to be grained contacts the roller brush 2 may be the same as or opposite to the direction a in which the aluminum web is transported.

In the graining device, the lower surface of the aluminum web is supported by the support rollers 4A and 4B and the upper surface thereof is scrubbed with the brush bristles 2B, whereby the aluminum web is grained.

2) Graining Treatment for Transferring Recesses and Protrusions of the Roll Surface onto the Plate Surface by Bring the Roll Surface Having the Recesses and Protrusions into Pressure Contact with the Plate Surface More specifically, pack rolling, transfer or other method is used in the final rolling step of the aluminum plate to be described later to bring the roll surface having the recesses and protrusions into pressure contact with the aluminum plate thereby forming the recesses and protrusions on the plate surface.

It is particularly preferred to use a method in which the surface having recesses and protrusions is brought into pressure contact with the aluminum plate while cold rolling for adjusting the final plate thickness or finish cold rolling for finishing the surface profile after the adjustment of the final plate thickness is carried out, whereby the pattern of the recesses and protrusions is transferred to the aluminum plate to obtain the plate having the pattern of the recesses and protrusions formed on the surface thereof. More specifically, the method described in JP 6-262203 A can be advantageously used.

It is particularly preferable to transfer onto the aluminum plate in the commonly performed final cold rolling step. The aluminum plate is preferably passed through rolls once to three times in rolling for transfer and the draft in each rolling step is preferably 1 to 20% and more preferably 5 to 15%.

Examples of the method of obtaining a mill roll which has recesses and protrusions formed on the surface thereof and which is to be used for transferring the recesses and protrusions include a method in which the surface of a steel roll is grained by air blasting, shot blasting or sand blasting; a method in which the roll surface is grained with a grindstone containing abrasive grains or sandpaper; a method in which the roll surface is irradiated with a laser beam to form pits thereon; and a method in which the roll surface is subjected to chemical or electrochemical graining treatment. When the chemical or electrochemical graining treatment is carried out, it is also possible to produce a pattern through exposure and development after a resist is applied to the roll surface and carry out etching treatment according to the produced pattern.

A wet-type or dry-type graining treatment may be carried out, but the dry-type graining treatment is preferred and air blasting is more preferably used.

The air pressure applied in air blasting is preferably 1 to 10 kg/cm$^2$. Examples of the grit used in air blasting include alumina, silica sand and metal powder. Among these, alumina is preferred. Alumina has preferably a mean particle size of 1 to 200 μm and more preferably 20 to 150 μm. Air blasting is preferably carried out twice.

The mill roll having recesses and protrusions formed on the surface thereof has preferably a mean surface roughness of 0.3 to 3 μm and more preferably 0.5 to 1.5 μm.

After the mill roll having recesses and protrusions formed on the surface thereof is obtained by any of the above methods, it is preferable to harden the surface by quenching or hard chromium plating to prevent wear of the surface. The layer formed by hard chromium plating has preferably a thickness of 3 to 15 μm.

For example, the methods described in JP 60-36195 A, JP 2002-251005 A, JP 60-203495 A, JP 55-74898 A and JP 62-111792 A can be used for the method of obtaining a mill roll having recesses and protrusions formed on the surface thereof.

3) Electrochemical Graining Treatment which is Carried Out in a Hydrochloric Acid-Based Aqueous Solution Using Electricity in an Amount of at Least 150 C/dm$^2$ Large crater-like undulations can be formed at a time by increasing the total amount of electricity furnished for the anodic reaction in the alternating current electrolysis using hydrochloric acid. In this case, fine asperities having an average aperture diameter of 0.0.01 to 0.4 μm are formed on the entire surface so as to be superposed on the crater-like undulations having an average aperture diameter of 10 to 30 μm.

In order to achieve such a graining, the total amount of electricity furnished for the anodic reaction of the aluminum plate at the end of the electrolytic reaction is preferably at least 150 C/dm$^2$ and more preferably at least 250 C/dm$^2$, but preferably not more than 800 C/dm$^2$ and more preferably not more than 500 C/dm$^2$. The current density during this process is preferably 20 to 100 A/dm$^2$ at the current peaks.

The conditions except the amount of electricity are the same as those in electrochemical graining treatment based on hydrochloric acid to be described later.

First Etching Treatment

Etching treatment is a treatment in which the surface layer of the above-described aluminum plate is dissolved by bringing the aluminum plate into contact with an alkaline aqueous solution.

The purpose of the first etching treatment carried out prior to the first electrochemical graining treatment is to enable the formation of uniform recesses in the first electrochemical graining treatment and to remove substances such as rolling oil, contaminants and a naturally oxidized film from the surface of the aluminum plate (rolled aluminum).

In the first etching treatment, the amount of material removed by etching from the surface to be subsequently subjected to the first electrochemical graining treatment is preferably 0.1 to 12 g/m$^2$ and more preferably 3 to 10 g/m$^2$. When the etching amount falls within the above ranges, substances such as rolling oil, contaminants and a naturally oxidized film are fully removed from the surface of the aluminum plate whereby uniform pits are formed in the subsequent first electrochemical graining treatment, and the amount of alkaline aqueous solution used is prevented from being increased, which is economically advantageous.

Alkalis that may be used in the alkaline aqueous solution are exemplified by caustic alkalis and alkali metal salts. Specific examples of suitable caustic alkalis include sodium hydroxide and potassium hydroxide. Specific examples of suitable alkali metal salts include alkali metal silicates such as sodium metasilicate, sodium silicate, potassium metasilicate and potassium silicate; alkali metal carbonates such as sodium carbonate and potassium carbonate; alkali metal aluminates such as sodium aluminate and potassium aluminate; alkali metal aldonates such as sodium gluconate and potassium gluconate; and alkali metal hydrogenphosphates such as sodium secondary phosphate, potassium secondary phosphate, sodium primary phosphate and potassium primary phosphate. Of these, caustic alkali solutions and solutions containing both a caustic alkali and an alkali metal aluminate are preferred on account of the high etch rate and low cost. An aqueous solution of sodium hydroxide is especially preferred.

In the first etching treatment, the alkaline aqueous solution has preferably a concentration of 1 to 50 wt % and more preferably 10 to 35 wt %.

It is preferable for the alkaline aqueous solution to contain aluminum ions. The aluminum ion concentration is preferably 0.01 to 10 wt % and more preferably 3 to 8 wt %.

The alkaline aqueous solution temperature is preferably 20 to 90° C. The treatment time is preferably 1 to 120 seconds.

Illustrative examples of methods for bringing the aluminum plate into contact with the alkaline aqueous solution include a method in which the aluminum plate is passed through a tank filled with an alkaline aqueous solution, a method in which the aluminum plate is immersed in a tank filled with an alkaline aqueous solution, and a method in which the surface of the aluminum plate is sprayed with an alkaline aqueous solution.

The most desirable of these is a method that involves spraying the surface of the aluminum plate with an alkaline aqueous solution. A method in which the etching solution is sprayed onto the aluminum plate at a rate of 10 to 100 L/min per spray line from preferably a plurality of spray lines bearing 2 to 5 mm diameter openings at a pitch of 10 to 50 mm is especially desirable.

Following the completion of alkali etching treatment, it is desirable to remove the etching solution from the aluminum plate with nip rollers, subject the plate to rinsing treatment with water for 1 to 10 seconds, then remove the water with nip rollers.

Rinsing treatment is preferably carried out by rinsing with a rinsing apparatus that uses a free-falling curtain of water and also by rinsing with spray lines.

FIG. 1 is a schematic cross-sectional view of an apparatus 100 which carries out rinsing with a free-falling curtain of water. As shown in FIG. 1, the apparatus 100 that carries out rinsing treatment with a free-falling curtain of water has a water holding tank 104 that holds water 102, a pipe 106 that feeds water to the water holding tank 104, and a flow distributor 108 that supplies a free-falling curtain of water from the water holding tank 104 to an aluminum plate 1.

In this apparatus 100, the pipe 106 feeds water 102 to the water holding tank 104. When the water 102 in the water holding tank 104 overflows, it is distributed by the flow distributor 108 and the free-falling curtain of water is supplied to the aluminum plate 1. A flow rate of 10 to 100 L/min is preferred when this apparatus 100 is used. The distance L over which the water 102 between the apparatus 100 and the aluminum plate 1 exists as a free-falling curtain of liquid is preferably from 20 to 50 mm. Moreover, it is preferable for the aluminum plate to be inclined at an angle $\alpha$ to the horizontal of 30 to 80°.

By using an apparatus like that in FIG. 1 which rinses the aluminum plate with a free-falling curtain of water, the aluminum plate can be uniformly rinsed. This in turn makes it possible to enhance the uniformity of treatment carried out prior to rinsing.

A preferred example of an apparatus that carries out rinsing treatment with a free-falling curtain of water is described in JP 2003-96584 A.

Alternatively, rinsing may be carried out with a spray line having a plurality of spray tips that discharge fan-like sprays of water and are disposed along the width of the aluminum plate. The interval between the spray tips is preferably 20 to 100 mm, and the amount of water discharged per spray tip is preferably 0.5 to 20 L/min. The use of a plurality of spray lines is preferred.

First Desmutting Treatment

After the first etching treatment, it is preferable to carry out acid pickling (first desmutting treatment) to remove contaminants (smut) remaining on the surface of the aluminum plate. Desmutting treatment is carried out by bringing an acidic aqueous solution into contact with the aluminum plate.

Examples of acids that may be used include nitric acid, sulfuric acid, hydrochloric acid, chromic acid, phosphoric acid, hydrofluoric acid and fluoroboric acid. More specifically, waste water from the aqueous sulfuric acid solution used in the anodizing treatment step to be described later, waste water from the aqueous nitric acid solution used in the first electrochemical graining treatment, and waste water from the aqueous hydrochloric acid solution used in the second electrochemical graining treatment can be preferably used.

In the first desmutting treatment, it is preferable to use an acidic solution containing 0.5 to 30 wt % of an acid and 0.5 to 10 wt % of aluminum ions. The first desmutting treatment is carried out by bringing the aluminum plate into contact with an acidic-solution containing 0.5 to 30 wt % of an acid such as hydrochloric acid, nitric acid or sulfuric acid (and 0.01 to 5 wt % of aluminum ions).

In the first desmutting treatment, the temperature of the acidic solution is preferably 25° C. to 90° C. and the treatment time is preferably 1 to 180 seconds.

Illustrative examples of the method of bringing the aluminum plate into contact with the acidic solution include passing the aluminum plate through a tank filled with the acidic solution, immersing the aluminum plate in a tank filled with the acidic solution, and spraying the acidic solution onto the surface of the aluminum plate.

Of these, a method in which the acidic solution is sprayed onto the surface of the aluminum plate is preferred. More specifically, a method in which the acidic solution is sprayed from at least one spray line, and preferably two or more spray lines, each having 2 to 5 mm diameter openings spaced at a pitch of 10 to 50 mm, at a rate of 10 to 100 L/min per spray line is desirable.

After desmutting treatment, it is preferable to remove the solution with nip rollers, then to carry out rinsing treatment with water for 1 to 10 seconds and again remove the water with nip rollers.

Rinsing treatment is the same as rinsing treatment following alkali etching treatment. However, it is preferable for the amount of water used per spray tip to be from 1 to 20 L/min.

First Electrochemical Graining Treatment

In the first electrochemical graining treatment, an alternating current is passed through the aluminum plate in an acid-containing aqueous solution for electrochemical graining treatment. The acid to be added to the aqueous solution is preferably nitric acid. The first electrochemical graining treatment using an aqueous solution containing nitric acid (electrolytic graining treatment with nitric acid) is capable of obtaining the aluminum plate on the surface of which pits having an average aperture diameter of 0.5 to 5 μm are formed.

The concentration of nitric acid in the aqueous solution is preferably 1 to 100 g/L. When the concentration falls within the above range, uniformity of the pits formed is enhanced.

The temperature of the aqueous solution is preferably 20 to 80° C. and more preferably 30 to 60° C. If the temperature is at least 20° C., the cost required for operating a refrigerator for cooling is not increased and the amount of ground water used for cooling can be suppressed. If the temperature is not more than 80° C., the corrosion resistance of the facilities is easily ensured.

The aqueous solution used may also contain a chloride compound containing a chloride ion such as aluminum chloride, sodium chloride or ammonium chloride or a nitrate compound containing a nitrate ion such as aluminum nitrate, sodium nitrate or ammonium nitrate. The aqueous solution may have dissolved therein metals which are present in the aluminum alloy, such as iron, copper, manganese, nickel, titanium, magnesium and silicon. Hypochlorous acid and hydrogen peroxide may be added in an amount of 1 to 100 g/L.

It is preferable to add aluminum chloride, aluminum nitrate or the like so that the aluminum ion concentration reaches 3 to 50 g/L. When the aluminum ion concentration falls within the above range, uniformity of the pits formed is enhanced. The replenishment amount of the aqueous solution is not increased too much.

Further, uniform graining of an aluminum plate containing a large amount of Cu is made possible by adding and using a compound which may form a complex with Cu. Examples of the compound which may form a complex with Cu include ammonia; amines obtained by substituting a hydrogen atom of the ammonia with an (aliphatic or aromatic) hydrocarbon group or the like as exemplified by methylamine, ethylamine, dimethylamine, diethylamine, trimethylamine, cyclohexylamine, triethanolamine, triisopropanolamine and EDTA (ethylenediaminetetraacetic acid); and metal carbonates such as sodium carbonate, potassium carbonate and potassium hydrogencarbonate. Ammonium salts such as ammonium nitrate, ammonium chloride, ammonium sulfate, ammonium phosphate and ammonium carbonate are also included. The temperature is preferably 10 to 60° C. and more preferably 20 to 50° C.

It is preferable to perform concentration control of each component of the aqueous solution using a concentration measuring method such as a multi-component concentration measuring method in combination with feedforward control and feedback control. This makes it possible to correctly control the concentration of the aqueous solution used for the electrolyte solution.

Examples of the multi-component concentration measuring method include a method in which the concentration is measured using the ultrasonic wave propagation velocity in the aqueous solution and the electrical conductivity of the electrolyte solution, neutralization titration, capillary electrophoretic analysis, isotachophoretic analysis and ion chromatography.

Depending on the type of a detector used, the ion chromatography is classified into ion chromatography for absorbance detection, non-suppressor type ion chromatography for conductivity detection and suppressor type ion chromatography. Among these, the suppressor type ion chromatography is preferable because the measurement stability is ensured.

The first electrochemical graining treatment may be carried out in accordance with, for example, the electrochemical graining processes (electrolytic graining processes) described in JP 48-28123 B (the term "JP XX-XXXXXX B" as used herein means an "examined Japanese patent publication") and GB 896,563. A sinusoidal alternating current is used in the electrolytic graining processes but special waveforms described in JP 52-58602 A may also be used. Use can also be made of the waveforms described in JP 3-79799 A. Other processes that may be employed for this purpose include those described in JP 55-158298 A, JP 56-28898 A, JP 52-58602 A, JP 52-152302 A, JP 54-85802 A, JP 60-190392 A, JP 58-120531 A, JP 63-176187 A, JP 1-5889 A, JP 1-280590 A, JP 1-118489 A, JP 1-148592 A, JP 1-178496 A, JP 1-188315 A, JP 1-154797 A, JP 2-235794 A, JP 3-260100 A, JP 3-253600 A, JP 4-72079 A, JP 4-72098 A, JP 3-267400 A and JP 1-141094 A. In addition to the above, electrolytic treatment can also be carried out using alternating currents of special frequency such as have been proposed in connection with methods for manufacturing electrolytic capacitors. These are described in, for example, U.S. Pat. No. 4,276,129 and U.S. Pat. No. 4,676,879.

Various electrolytic cells and power supplies have been proposed for use in the first electrochemical graining treatment. For example, use may be made of those described in U.S. Pat. No. 4,203,637, JP 56-123400 A, JP 57-59770 A, JP 53-12738 A, JP 53-32821 A, JP 53-32822 A, JP 53-32823 A, JP 55-122896 A, JP 55-132884 A, JP 62-127500 A, JP 1-52100 A, JP 1-52098 A, JP 60-67700 A, JP 1-230800 A, JP 3-257199 A, JP 52-58602 A, JP 52-152302 A, JP 53-12738 A, JP 53-12739 A, JP 53-32821 A, JP 53-32822 A, JP 53-32833 A, JP 53-32824 A, JP 53-32825 A, JP 54-85802 A, JP 55-122896 A, JP 55-132884 A, JP 48-28123 B, JP 51-7081 B, JP 52-133838 A, JP 52-133840 A, JP 52-133844 A, JP 52-133845 A, JP 53-149135 A and JP 54-146234 A.

For example, a power supply using a commercial alternating current or an inverter-controlled power supply can be used for the power supply. Among these, an inverter-controlled power supply using an IGBT (Insulated Gate Bipolar Transistor) is preferable because this power supply is excellent in the tracking capability when the current value (current density of the aluminum plate) is kept constant by changing the voltage with respect to the changes of the width and thickness of the aluminum plate and the concentration of each component in the electrolyte solution.

No particular limitation is imposed on the alternating current waveform used in the first electrochemical graining treatment. For example, a sinusoidal, square, trapezoidal or triangular waveform may be used. "Trapezoidal waveform" refers herein to a waveform like that shown in FIG. 2.

The amount of electricity in the first electrochemical graining treatment is preferably in the range of 1 to 1000 C/$dm^2$ and more preferably 50 to 300 C/$dm^2$ in terms of the total amount of electricity when the aluminum plate serves as an anode. The current density is preferably 10 to 100 A/$dm^2$. At a current density of at least 10 A/$dm^2$, the productivity is enhanced. At a current density of not more than 100 A/$dm^2$, the voltage is not so high and the power capacity is not increased so much, which may lead to the reduction of the power supply cost.

Figure 3:
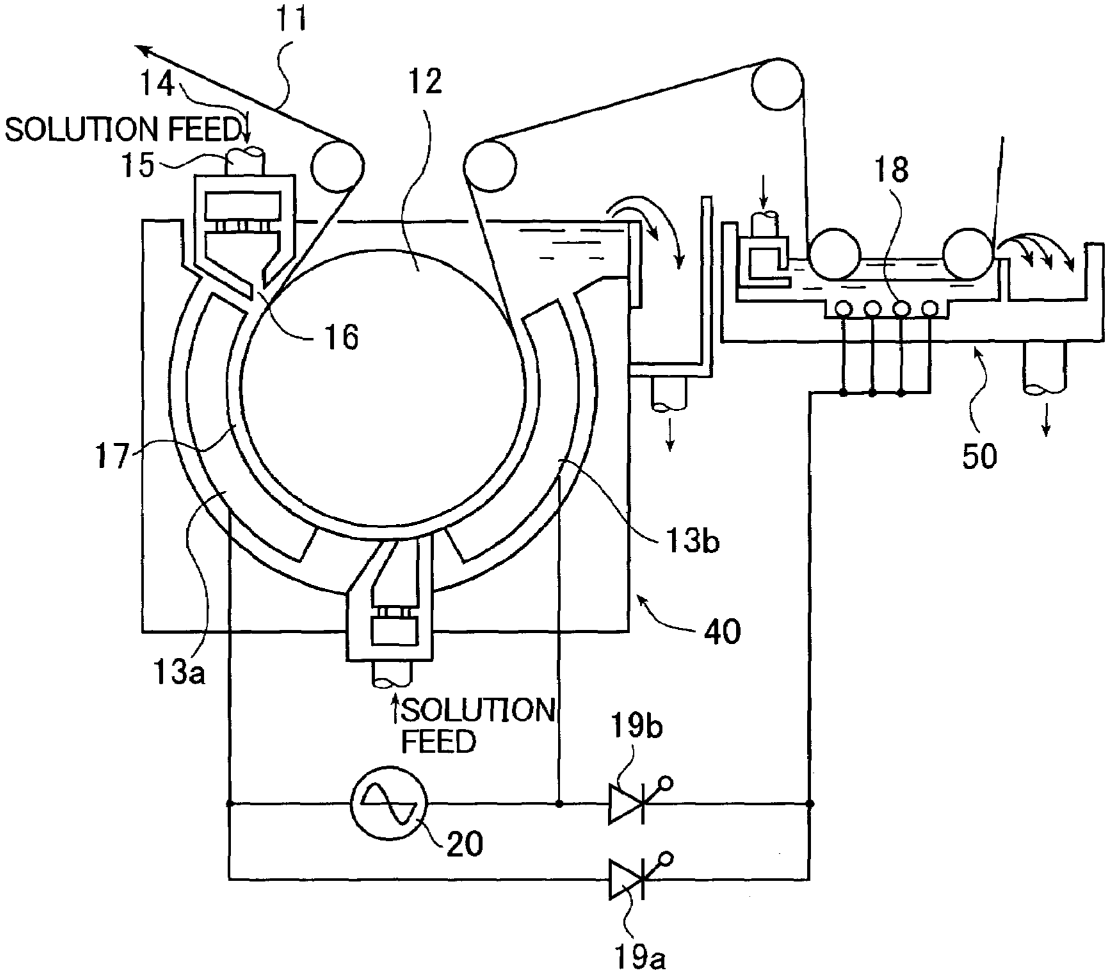
FIG. 3 is a side view of a radial electrolytic cell that is used to carry out electrochemical graining treatment with alternating current in the method of manufacturing a lithographic printing plate support according to the present invention.

FIG. 3 is a side view of a radial electrolytic cell that is used to carry out electrochemical graining treatment using alternating current in the method of manufacturing a lithographic printing plate support according to the present invention.

One or more AC power supplies may be connected to the electrolytic cell. To control the anode/cathode current ratio of the alternating current applied to the aluminum plate opposite to the main electrodes and thereby carry out uniform graining and to dissolve carbon from the main electrodes, it is advantageous to provide an auxiliary anode and divert some of the alternating current as shown in FIG. 3. FIG. 3 shows an aluminum plate 11, a radial drum roller 12, main electrodes 13*a* and 13*b*, an electrolytic treatment solution 14, a solution feed inlet 15, a slit 16, a solution channel 17, an auxiliary anode 18, thyristors 19*a* and 19*b*, an AC power supply 20, a main electrolytic cell 40 and an auxiliary anode cell 50. By using a rectifying or switching device to divert some of the current as direct current to the auxiliary anode provided in the separate cell from that containing the two main electrodes, it is possible to control the ratio between the current value furnished for the anodic reaction which acts on the aluminum plate opposite to the main electrodes and the current value furnished for the cathodic reaction. The current ratio (ratio between the total amount of electricity when the aluminum plate serves as an anode and the total amount of electricity when the aluminum plate serves as an cathode) is preferably 0.9 to 3 and more preferably 0.9 to 1.0.

Any known electrolytic cell employed for surface treatment, including vertical, flat and radial type electrolytic cells, may be used to carry out electrochemical graining treatment. Radial-type electrolytic cells such as those described in JP 5-195300 A are especially preferred. The electrolyte solution is passed through the electrolytic cell either parallel or counter to the direction in which the aluminum web advances.

Following completion of the first electrochemical graining treatment, it is desirable to remove the solution from the aluminum plate with nip rollers, rinse the plate with water for 1 to 10 seconds, then remove the water with nip rollers.

Rinsing treatment is preferably carried out using a spray line. The spray line used in rinsing treatment is typically one having a plurality of spray tips, each of which discharges a fan-like spray of water and is situated along the width of the aluminum plate. The interval between the spray tips is preferably 20 to 100 mm, and the amount of water discharged per spray tip is preferably 1 to 20 L/min. Rinsing with a plurality of spray lines is preferred.

Second Etching Treatment

The purpose of the second etching treatment carried out between the first electrochemical graining treatment and the second electrochemical graining treatment is to dissolve smut that arises in the first electrochemical graining treatment and to dissolve the edges of the pits formed by the first electrochemical graining treatment. The present step dissolves the edges of the large pits formed by the first electrochemical graining treatment, smoothing the surface and discouraging ink from catching on such edges. As a result, presensitized plates of excellent scumming resistance can be obtained.

The second etching treatment is basically the same as the first etching treatment. The etching amount is preferably 0.1 to 10 $g/m^2$.

Second Desmutting Treatment

After the second etching treatment has been carried out, it is preferable to carry out acid pickling (second desmutting treatment) to remove contaminants (smut) remaining on the surface of the aluminum plate. The second desmutting treatment can be carried out in the same way as the first desmutting treatment.

Second Electrochemical Graining Treatment

In the second electrochemical graining treatment, an alternating current is passed through the aluminum plate in an acid-containing aqueous solution for electrochemical graining treatment. The acid to be added to the aqueous solution is preferably hydrochloric acid. The second electrochemical graining treatment using an aqueous solution containing hydrochloric acid (electrolytic graining treatment with hydrochloric acid) is capable of obtaining the aluminum plate on the surface of which pits having an average aperture diameter of 0.01 to 0.2 μm are formed.

The second electrochemical graining treatment is basically the same as the first electrochemical graining treatment. Different points from the first electrochemical graining treatment will be mainly described below.

The aqueous solution has preferably a hydrochloric acid concentration of 1 to 100 g/L. When the concentration falls within the above range, uniformity of the pits formed on the surface of the aluminum plate is enhanced.

The aqueous solution contains preferably 0.05 to 10 g/L of sulfuric acid or nitric acid. Sulfuric acid and nitric acid form an oxide film through an anodic reaction. The surface having uniform asperities can be thus formed.

The aluminum ion concentration in the aqueous solution is preferably 3 to 50 g/L. When the aluminum ion concentration falls within the above range, uniformity of the pits formed is enhanced and the replenishment amount of the aqueous solution is not increased too much.

No particular limitation is imposed on the AC power supply waveform used in the second electrochemical graining treatment. For example, a sinusoidal, square, trapezoidal or triangular waveform may be used.

The amount of electricity in the second electrochemical graining treatment is preferably at least 20 $C/dm^2$, more preferably 20 to 100 $C/dm^2$ and even more preferably 30 to 70 $C/dm^2$ in terms of the total amount of electricity when the aluminum plate serves as an anode.

Third Etching Treatment

The purpose of the third etching treatment carried out after the second electrochemical graining treatment is to dissolve smut that arises in the second electrochemical graining treatment and to dissolve the edges of the pits formed by the second electrochemical graining treatment.

The third etching treatment is basically the same as the first etching treatment. The etching amount is preferably 0.01 to 0.08 $g/m^2$, more preferably 0.03 to 0.06 $g/m^2$, and even more preferably 0.03 to 0.05 $g/m^2$.

When the etching amount is within the above range, effective use can be made of the topography of the small wave structure formed by electrolysis with hydrochloric acid. Therefore, the scumming resistance and scratch resistance are further enhanced.

Third Desmutting Treatment

After the third etching treatment has been carried out, it is preferable to carry out acid pickling (third desmutting treatment) to remove contaminants (smut) remaining on the surface of the aluminum plate. The third desmutting treatment can be carried out basically in the same way as the first desmutting treatment.

When the same type of the electrolyte solution as that used in the subsequent anodizing treatment is used for the desmutting solution in the third desmutting treatment, solution removal with nip rollers and rinsing with water that are to be carried out after the desmutting treatment can be omitted.

The third desmutting treatment is preferably carried out in an electrolytic cell of an anodizing apparatus used in anodizing treatment to be described later where the aluminum plate is to be subjected to cathodic reaction. This configuration eliminates the necessity for providing an independent desmutting bath for the third desmutting treatment, which may lead to equipment cost reduction.

Anodizing Treatment

The aluminum plate treated as described above is also subjected to anodizing treatment. Anodizing treatment can be carried out by any suitable method used in the field to which the present invention pertains. More specifically, an anodized layer can be formed on the surface of the aluminum plate by passing a current through the aluminum plate as the anode in, for example, a solution having a sulfuric acid concentration of 50 to 300 g/L and an aluminum ion concentration of up to 5 wt %. The solution used for anodizing treatment includes any one or combination of two or more of, for example, sulfuric acid, phosphoric acid, chromic acid, oxalic acid, sulfamic acid, benzenesulfonic acid and amidosulfonic acid.

It is acceptable for ingredients ordinarily present in at least the aluminum plate, electrodes, tap water, ground water and the like to be present in the electrolyte solution. In addition, secondary and tertiary ingredients may be added. Here, "second and tertiary ingredients" includes, for example, the ions of metals such as sodium, potassium, magnesium, lithium, calcium, titanium, aluminum, vanadium, chromium, manganese, iron, cobalt, nickel, copper and zinc; cations such as ammonium ions; and anions such as nitrate ions, carbonate ions, chloride ions, phosphate ions, fluoride ions, sulfite ions, titanate ions, silicate ions and borate ions. These may be present in a concentration of about 0 to 10,000 ppm.

The anodizing treatment conditions vary empirically according to the electrolyte solution used, although it is generally suitable for the solution to have a concentration of 1 to 80 wt % and a temperature of 5 to 70° C., and for the current density to be 0.5 to 60 A/$dm^2$, the voltage to be 1 to 100 V, and the electrolysis time to be 15 seconds to 50 minutes. These conditions may be adjusted to obtain the desired anodized layer weight.

Methods that may be used to carry out anodizing treatment include those described in JP 54-81133 A, JP 57-47894 A, JP 57-51289 A, JP 57-51290 A, JP 57-54300 A, JP 57-136596 A, JP 58-107498 A, JP 60-200256 A, JP 62-136596 A, JP 63-176494 A, JP 4-176897 A, JP 4-280997 A, JP 6-207299 A, JP 5-24377 A, JP 5-32083 A, JP 5-125597 A and JP 5-195291 A.

Of these, as described in JP 54-12853 A and JP 48-45303 A, it is preferable to use a sulfuric acid solution as the electrolyte solution. The electrolyte solution has a sulfuric acid concentration of preferably 10 to 300 g/L (1 to 30 wt %), and more preferably 50 to 200 g/L (5 to 20 wt %), and an aluminum ion concentration of preferably 1 to 25 g/L (0.1 to 2.5 wt %), and more preferably 2 to 10 g/L (0.2 to 1 wt %). Such an electrolyte solution can be prepared by adding a compound such as aluminum sulfate to dilute sulfuric acid having a sulfuric acid concentration of 50 to 200 g/L.

Control of the electrolyte solution composition is typically carried out using a method similar to that employed in the nitric acid electrolysis described above. That is, control is preferably achieved by preparing a matrix of the electrical conductivity, specific gravity and temperature or a matrix of the conductivity, ultrasonic wave propagation velocity and temperature with respect to a matrix of the sulfuric acid concentration and the aluminum ion concentration.

The electrolyte solution has a temperature of preferably 25 to 55° C., and more preferably 30 to 50° C.

When anodizing treatment is carried out in an electrolyte solution containing sulfuric acid, direct current or alternating current may be applied across the aluminum plate and the counter electrode.

When a direct current is applied to the aluminum plate, the current density is preferably 1 to 60 A/$dm^2$, and more preferably 5 to 40 A/$dm^2$.

To keep burnt deposits (areas of the anodized layer which are thicker than surrounding areas) from arising on portions of the aluminum plate due to the concentration of current when anodizing treatment is carried out as a continuous process, it is preferable to apply current at a low density of 5 to 10 A/$dm^2$ at the start of anodizing treatment and to increase the current density to 30 to 50 A/$dm^2$ or more as anodizing treatment proceeds.

Specifically, it is preferable for current from the DC power supplies to be allocated such that current from downstream DC power supplies is equal to or greater than current from upstream DC power supplies. Current allocation in this way will discourage the formation of burnt deposits, enabling high-speed anodization to be carried out.

When anodizing treatment is carried out as a continuous process, this is preferably done using a system that supplies power to the aluminum plate through the electrolyte solution.

By carrying out anodizing treatment under such conditions, a porous film having numerous micropores can be obtained. These micropores generally have a mean diameter of about 5 to 50 nm and a mean pore density of about 300 to 800 pores/$\mu m^2$.

The weight of the anodized layer is preferably 1 to 5 g/$m^2$. At a weight of 1 g/$m^2$ or more, scratches are not readily formed on the plate. A weight of not more than 5 g/$m^2$ does not require a large amount of electric power, which is economically advantageous. An anodized layer weight of 1.5 to 4 g/$m^2$ is more preferred. It is also desirable for anodizing treatment to be carried out in such a way that the difference in the anodized layer weight between the center of the aluminum plate and the areas near the edges is not more than 1 g/$m^2$.

The weight of the anodized layer on the opposite side to the surface having been subjected to the electrochemical graining treatment is preferably 0.1 to 1 g/$m^2$. At a weight of 0.1 g/$m^2$ or more, scratches are not readily formed on the rear surface and hence when the presensitized plates are stacked on top of each other, scuffing of the image recording layer brought into contact with the rear surface is prevented. A weight of not more than 1 g/$m^2$ is economically advantageous.

Examples of electrolysis apparatuses that may be used in anodizing treatment include those described in JP 48-26638 A, JP 47-18739 A, JP 58-24517 B and JP 2001-11698 A.

Figure 4:
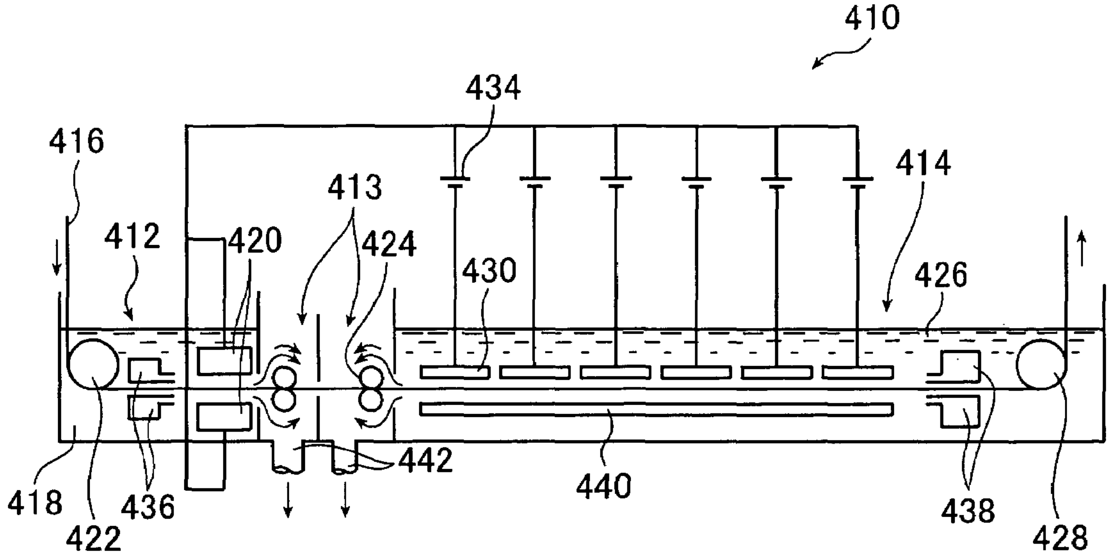
FIG. 4 is a schematic view of an anodizing apparatus that is used in anodizing treatment in the method of manufacturing a lithographic printing plate support according to the present invention.

Of these, an apparatus like that shown in FIG. 4 is preferred. FIG. 4 is a schematic view showing an exemplary apparatus for anodizing the surface of an aluminum plate.

In an anodizing apparatus 410 shown in FIG. 4, to apply a current to an aluminum plate 416 through an electrolyte solution, a power supplying cell 412 is disposed on the upstream side of the aluminum plate 416 in its moving direction and an anodizing treatment tank 414 is disposed on the downstream side. The aluminum plate 416 is moved by path rollers 422 and 428 in the direction indicated by the arrows in FIG. 4. The power supplying cell 412 through which the aluminum plate 416 first passes is provided with anodes 420 which are connected to the positive poles of DC power supplies 434; and the aluminum plate 416 serves as the cathode. Hence, a cathodic reaction arises at the aluminum plate 416.

The anodizing treatment tank 414 through which the aluminum plate 416 next passes is provided with a cathode 430 which is connected to the negative poles of the DC power supplies 434; the aluminum plate 416 serves as the anode. Hence, an anodic reaction arises at the aluminum plate 416, and an anodized layer is formed on the surface of the aluminum plate 416.

The aluminum plate 416 is at a distance of preferably 50 to 200 mm from the cathode 430. The cathode 430 may be made of aluminum. To facilitate the venting of hydrogen gas generated by the anodic reaction from the system, it is preferable for the cathode 430 to be divided into a plurality of sections in the direction of advance of the aluminum plate 416 rather than to be a single electrode having a broad surface area.

As shown in FIG. 4, it is advantageous to provide, between the power supplying cell 412 and the anodizing treatment tank 414, an intermediate tank 413 that does not hold the electrolyte solution. By providing the intermediate tank 413, the current can be kept from passing directly from the anode 420 to the cathode 430 and bypassing the aluminum plate 416. It is preferable to minimize the bypass current by providing nip rollers 424 in the intermediate tank 413 to remove the solution from the aluminum plate 416. The electrolyte solution removed by the nip rollers 424 is discharged to the outside of the anodizing apparatus 410 through a discharge outlet 442.

To lower the voltage loss, an electrolyte solution 418 that is supplied to the power supplying cell 412 is set at a higher temperature and/or concentration than an electrolyte solution 426 that is supplied to the anodizing treatment tank 414. Moreover, the composition, temperature and other characteristics of the electrolyte solutions 418 and 426 are set based on such considerations as the anodized layer forming efficiency, the shapes of micropores of the anodized layer, the hardness of the anodized layer, the voltage, and the cost of the electrolyte solution.

The power supplying cell 412 and the anodizing treatment tank 414 are supplied with electrolyte solutions injected by solution feed nozzles 436 and 438. To ensure that the distribution of electrolyte solution remains uniform and thereby prevent the localized concentration of current on the aluminum plate 416 in the anodizing treatment tank 414, the solution feed nozzles 436 and 438 have a construction in which slits are provided to keep the flow of injected liquid constant in the width direction.

In the anodizing treatment tank 414, a shield 440 is provided on the opposite side of the aluminum plate 416 from the cathode 430 to check the flow of current to the opposite side of the aluminum plate 416 from the surface on which an anodized layer is to be formed. The interval between the aluminum plate 416 and the shield 440 is preferably 5 to 30 mm. It is preferable to use a plurality of DC power supplies 434 with their positive poles connected in common, thereby enabling control of the current distribution within the anodizing treatment tank 414.

Sealing Treatment

Sealing treatment may be carried out as required in the present invention to seal micropores in the anodized layer. Such treatment can enhance the developability (sensitivity) of the presensitized plate.

Anodized layers are known to be porous films having micropores which extend in a direction substantially perpendicular to the surface of the film. In the present invention, it is advantageous to carry out sealing treatment to a high sealing ratio. The sealing ratio is preferably at least 50%, more preferably at least 70%, and even more preferably at least 90%. "Sealing ratio," as used herein, is defined as follows.

Sealing ratio=[(surface area before sealing)−(surface area after sealing)]/(surface area before sealing)× 100%

The surface area can be measured using a simple BET-type surface area analyzer, such as Quantasorb (Yuasa Ionics Inc.).

Sealing may be carried out using any known method without particular limitation. Illustrative examples of sealing methods that may be used include hot water treatment, boiling water treatment, steam treatment, dichromate treatment, nitrite treatment, ammonium acetate treatment, electrodeposition sealing treatment, hexafluorozirconic acid treatment like that described in JP 36-22063 B, treatment with an aqueous solution containing a phosphate and an inorganic fluorine compound like that described in JP 9-244227 A, treatment with a sugar-containing aqueous solution like that described in JP 9-134002 A, treatment in a titanium and fluorine-containing aqueous solution like those described in JP 2000-81704 A and JP 2000-89466 A, and alkali metal silicate treatment like that described in U.S. Pat. No. 3,181,461.

One preferred type of sealing treatment is alkali metal silicate treatment. This can be carried out using a pH 10 to 13 aqueous solution of an alkali metal silicate at 25° C. that does not undergo solution gelation or dissolve the anodized layer, and by suitably selecting the treatment conditions, such as the alkali metal silicate concentration, the treatment temperature and the treatment time. Preferred alkali metal silicates include sodium silicate, potassium silicate and lithium silicate. The aqueous solution of alkali metal silicate may include also a hydroxide compound such as sodium hydroxide, potassium hydroxide or lithium hydroxide in order to increase the pH.

If necessary, an alkaline earth metal salt and/or a Group 4 (Group IVA) metal salt may also be included in the aqueous alkali metal silicate solution. Examples of suitable alkaline earth metal salts include the following water-soluble salts: nitrates such as calcium nitrate, strontium nitrate, magnesium nitrate and barium nitrate; and also sulfates, hydrochlorides, phosphates, acetates, oxalates, and borates of alkaline earth metals. Exemplary Group 4 (Group IVA) metal salts include titanium tetrachloride, titanium trichloride, titanium potassium fluoride, titanium potassium oxalate, titanium sulfate, titanium tetraiodide, zirconyl chloride, zirconium dioxide, and zirconium tetrachloride. These alkaline earth metal salts and Group 4 (Group IVA) metal salts may be used singly or in combinations of two or more thereof.

The concentration of the aqueous alkali metal silicate solution is preferably 0.01 to 10 wt %, and more preferably 0.05 to 5.0 wt %.

Another preferred type of sealing treatment is hexafluorozirconic acid treatment. Such treatment is carried out using a hexafluorozirconate such as sodium hexafluorozirconate and potassium hexafluorozirconate. It is particularly preferable to use sodium hexafluorozirconate. This treatment allows the presensitized plate to have excellent sensitivity (developability). The hexafluorozirconate solution used in this treatment has a concentration of preferably 0.01 to 2 wt %, and more preferably 0.1 to 0.3 wt %.

It is desirable for the hexafluorozirconate solution to contain sodium dihydrogenphosphate in a concentration of preferably 0.01 to 3 wt %, and more preferably 0.1 to 0.3 wt %.

The hexafluorozirconate solution may contain aluminum ions. In this case, the hexafluorozirconate solution has preferably an aluminum ion concentration of 1 to 500 mg/L.

The sealing treatment temperature is preferably 20 to 90° C., and more preferably 50 to 80° C.

The sealing treatment time (period of immersion in the solution) is preferably 1 to 20 seconds, and more preferably 5 to 15 seconds.

If necessary, sealing treatment may be followed by surface treatment such as the above-described alkali metal silicate treatment or treatment in which the aluminum plate is immersed in or coated with a solution containing polyvinylphosphonic acid, polyacrylic acid, a polymer or copolymer having pendant groups such as sulfo groups, or any of the organic compounds, or salts thereof, having an amino group, and a group selected from phosphinate group, phosphonate group and phosphate group mentioned in JP 11-231509 A.

Following sealing treatment, it is desirable to carry out the hydrophilizing treatment described below.

Hydrophilizing Treatment

Hydrophilizing treatment may be carried out after anodizing treatment or sealing treatment. Illustrative examples of suitable hydrophilizing treatments include the potassium hexafluorozirconate treatment described in U.S. Pat. No. 2,946,638, the phosphomolybdate treatment described in U.S. Pat. No. 3,201,247, the alkyl titanate treatment described in GB 1,108,559, the polyacrylic acid treatment described in DE 1,091,433, the polyvinylphosphonic acid treatments described in DE 1,134,093 and GB 1,230,447, the phosphonic acid treatment described in JP 44-6409 B, the phytic acid treatment described in U.S. Pat. No. 3,307,951, the treatment involving the divalent metal salt of a lipophilic organic polymeric compound described in JP 58-16893 A and JP 58-18291 A, treatment like that described in U.S. Pat. No. 3,860,426 in which an aqueous metal salt (e.g., zinc acetate)-containing hydrophilic cellulose (e.g., carboxymethyl cellulose) undercoat is provided, and a treatment like that described in JP 59-101651 A in which a sulfo group-bearing water-soluble polymer is undercoated.

Additional examples of suitable hydrophilizing treatments include undercoating treatment using the phosphates mentioned in JP 62-19494 A, the water-soluble epoxy compounds mentioned in JP 62-33692 A, the phosphoric acid-modified starches mentioned in JP 62-97892 A, the diamine compounds mentioned in JP 63-56498 A, the inorganic or organic salts of amino acids mentioned in JP 63-130391 A, the carboxyl or hydroxyl group-bearing organic phosphonic acids mentioned in JP 63-145092 A, the amino group and phosphonic acid group-bearing compounds mentioned in JP 63-165183 A, the specific carboxylic acid derivatives mentioned in JP 2-316290 A, the phosphate esters mentioned in JP 3-215095 A, the compounds having one amino group and one phosphorus oxo acid group mentioned in JP 3-261592 A, the aliphatic or aromatic phosphonic acids (e.g., phenylphosphonic acid) mentioned in JP 5-246171 A, the sulfur atom-bearing compounds (e.g., thiosalicylic acid) mentioned in JP 1-307745 A, and the phosphorus oxo acid group-bearing compounds mentioned in JP 4-282637 A.

Coloration with an acid dye as mentioned in JP 60-64352 A may also be carried out.

It is preferable to carry out hydrophilizing treatment by a method in which the aluminum plate is immersed in an aqueous solution of an alkali metal silicate such as sodium silicate or potassium silicate, or is coated with a hydrophilic vinyl polymer or some other hydrophilic compound so as to form a hydrophilic undercoat.

Hydrophilizing treatment with an aqueous solution of an alkali metal silicate such as sodium silicate or potassium silicate can be carried out according to the processes and procedures described in U.S. Pat. No. 2,714,066 and U.S. Pat. No. 3,181,461.

Illustrative examples of suitable alkali metal silicates include sodium silicate, potassium silicate and lithium silicate. Suitable amounts of hydroxides such as sodium hydroxide, potassium hydroxide or lithium hydroxide may be included in the aqueous alkali metal silicate solution.

An alkaline earth metal salt or a Group 4 (Group IVA) metal salt may also be included in the aqueous alkali metal silicate solution. Examples of suitable alkaline earth metal salts include nitrates such as calcium nitrate, strontium nitrate, magnesium nitrate and barium nitrate; and also sulfates, hydrochlorides, phosphates, acetates, oxalates, and borates. Exemplary Group 4 (Group IVA) metal salts include titanium tetrachloride, titanium trichloride, titanium potassium fluoride, titanium potassium oxalate, titanium sulfate, titanium tetraiodide, zirconyl chloride, zirconium dioxide and zirconium tetrachloride. These alkaline earth metal salts and Group 4 (Group IVA) metal salts may be used singly or in combinations of two or more thereof.

The amount of silicon adsorbed as a result of alkali metal silicate treatment can be measured with a fluorescent x-ray analyzer, and is preferably about 1.0 to 15.0 mg/$m^2$.

This alkali metal silicate treatment has the effect of enhancing the resistance at the surface of the lithographic printing plate support to dissolution by the alkaline developer, suppressing the leaching of aluminum ingredients into the developer, and reducing the generation of development scum arising from developer fatigue.

Hydrophilizing treatment involving the formation of a hydrophilic undercoat can also be carried out in accordance with the conditions and procedures described in JP 59-101651 A and JP 60-149491 A.

Hydrophilic vinyl polymers that may be used in such a method include copolymers of a sulfo group-bearing vinyl polymerizable compound such as polyvinylsulfonic acid or sulfo group-bearing p-styrenesulfonic acid with a conventional vinyl polymerizable compound such as an alkyl (meth) acrylate. Examples of hydrophilic compounds that may be used in this method include compounds having at least one group selected from among —$NH_2$ groups, —COOH groups and sulfo groups.

Drying

After the lithographic printing plate support has been obtained as described above, it is advantageous to dry the surface of the support before providing an image recording layer thereon. Drying is preferably carried out after the support has been rinsed with water and the water removed with nip rollers following the final surface treatment.

The drying temperature is preferably at least 70° C., and more preferably at least 80° C., but preferably not more than 110° C., and more preferably not more than 100° C.

The drying time is preferably at least 1 second, and preferably at least 2 seconds, but preferably not more than 20 seconds, and more preferably not more than 15 seconds.

Aluminum Plate (Rolled Aluminum)

An aluminum plate used for a lithographic printing plate support of the present invention will be described below. A known aluminum plate can be used to obtain the inventive lithographic printing plate support. The aluminum plate used in the present invention is made of a dimensionally stable metal composed primarily of aluminum; that is, aluminum or aluminum alloy. Aside from plates of pure aluminum, alloy plates composed primarily of aluminum and containing small amounts of other elements can also be used.

In the present specification, the various supports made of aluminum or aluminum alloy as described above are referred to generically as "aluminum plate." Other elements which may be present in the aluminum alloy include silicon, iron, copper, manganese, magnesium, chromium, zinc, bismuth, nickel and titanium. The content of other elements in the alloy is not more than 10 wt %.

Aluminum plates used for a lithographic printing plate support of the present invention are not specified here as to composition, but include known materials that appear in the $4^{th}$ edition of Aluminum Handbook published in 1990 by the Japan Light Metal Association, such as aluminum plates having the designations JIS A1050, JIS A1100 and JIS A1070, and manganese-containing aluminum-manganese-based aluminum plates having the designation JIS A3004 and International Alloy Designation 3103A. To increase the tensile strength, it is preferable to use aluminum-magnesium alloys and aluminum-manganese-magnesium alloys (JIS A3005) composed of the above aluminum alloys to which at least 0.1 wt % of magnesium has been added. Aluminum-zirconium alloys and aluminum-silicon alloys which additionally contain zirconium and silicon, respectively may also be used. Use can also be made of aluminum-magnesium-silicon alloys.

An aluminum plate obtained by rolling a UBC (used beverage can) ingot into which a used aluminum beverage can in a molten state is formed is also usable.

The Cu content in the aluminum plate is preferably 0.00 wt % or more, more preferably at least 0.01 wt % and even more preferably at least 0.02 wt % but is preferably 0.15 wt % or less, more preferably 0.11 wt % or less and even more preferably 0.03 wt % or less. An aluminum plate containing 0.07 to 0.09 wt % of Si, 0.20 to 0.29 wt % of Fe, not more than 0.03 wt % of Cu, not more than 0.01 wt % of Mn, not more than 0.01 wt % of Mg, not more than 0.01 wt % of Cr, not more than 0.01 wt % of Zn, not more than 0.02 wt % of Ti and not less than 99.5 wt % of Al is particularly preferred.

The present applicant has disclosed related art concerning JIS 1050 materials in JP 59-153861 A, JP 61-51395 A, JP 62-146694 A, JP 60-215725 A, JP 60-215726 A, JP 60-215727 A, JP 60-216728 A, JP 61-272367 A, JP 58-11759 A, JP 58-42493 A, JP 58-221254 A, JP 62-148295 A, JP 4-254545 A, JP 4-165041 A, JP 3-68939 B, JP 3-234594 A, JP 1-47545 B and JP 62-140894 A. The art described in JP 1-35910 B and JP 55-28874 B is also known.

This applicant has also disclosed related art concerning JIS 1070 materials in JP 7-81264 A, JP 7-305133 A, JP 8-49034 A, JP 8-73974 A, JP 8-108659 A and JP 8-92679 A.

In addition, this applicant has disclosed related art concerning aluminum-magnesium alloys in JP 62-5080 B, JP 63-60823 B, JP 3-61753 B, JP 60-203496 A, JP 60-203497 A, JP 3-11635 B, JP 61-274993 A, JP 62-23794 A, JP 63-47347 A, JP 63-47348 A, JP 63-47349 A, JP 64-1293 A, JP 63-135294 A, JP 63-87288 A, JP 4-73392 B, JP 7-100844 B, JP 62-149856 A, JP 4-73394 B, JP 62-181191 A, JP 5-76530 B, JP 63-30294 A, JP 6-37116 B, JP 2-215599 A and JP 61-201747 A.

This applicant has disclosed related art concerning aluminum-manganese alloys in JP 60-230951 A, JP 1-306288 A, JP 2-293189 A, JP 54-42284 B, JP 4-19290 B, 4-19291 B, JP 4-19292 B, JP 61-35995 A, JP 64-51992 A, JP 4-226394 A, U.S. Pat. No. 5,009,722 and U.S. Pat. No. 5,028,276.

The present applicant has disclosed related art concerning aluminum-manganese-magnesium alloys in JP 62-86143 A, JP 3-222796 A, JP 63-60824 B, JP 60-63346 A, JP 60-63347 A, JP 1-293350 A, EP 223,737, U.S. Pat. No. 4,818,300 and GB 1,222,777.

Also, this applicant has disclosed related art concerning aluminum-zirconium alloys in JP 63-15978 B, JP 61-51395 A, JP 63-143234 A and JP 63-143235 A.

This applicant has disclosed related art concerning aluminum-magnesium-silicon alloys in GB 1,421,710.

The aluminum alloy may be formed into a plate by a method such as the following, for example. First, an aluminum alloy melt that has been adjusted to a given alloying ingredient content is subjected to cleaning treatment by an ordinary method, then is cast. Cleaning treatment, which is carried out to remove hydrogen and other unnecessary gases from the melt, typically involves flux treatment; degassing treatment using argon gas, chlorine gas or the like; filtering treatment using, for example, what is referred to as a rigid media filter (e.g., ceramic tube filters, ceramic foam filters), a filter that employs a filter medium such as alumina flakes or alumina balls, or a glass cloth filter; or a combination of degassing treatment and filtering treatment.

Cleaning treatment is preferably carried out to prevent defects due to foreign matter such as nonmetallic inclusions and oxides in the melt, and defects due to dissolved gases in the melt. The filtration of melts is described in, for example, JP 6-57432 A, JP 3-162530 A, JP 5-140659 A, JP 4-231425 A, JP 4-276031 A, JP 5-311261 A, and JP 6-136466 A. The degassing of melts is described in, for example, JP 5-51659 A and JP 5-49148 U (the term "JP XX-XXXXXX U" as used herein means an "unexamined published Japanese utility model application"). The present applicant also discloses related art concerning the degassing of melts in JP 7-40017 A.

Next, the melt that has been subjected to cleaning treatment as described above is cast. Casting processes include those which use a stationary mold, such as direct chill casting, and those which use a moving mold, such as continuous casting.

In direct chill casting, the melt is solidified at a cooling speed of 0.5 to 30° C. per second. At less than 1° C., many coarse intermetallic compounds may be formed. When direct chill casting is carried out, an ingot having a thickness of 300 to 800 mm can be obtained. If necessary, this ingot is scalped by a conventional method, generally removing 1 to 30 mm, and preferably 1 to 10 mm, of material from the surface. The ingot may also be optionally soaked, either before or after scalping. In cases where soaking is carried out, the ingot is heat treated at 450 to 620° C. for 1 to 48 hours to prevent the coarsening of intermetallic compounds. The effects of soaking treatment may be inadequate if heat treatment is shorter than one hour. If soaking treatment is not carried out, this can have the advantage of lowering costs.

The ingot is then hot-rolled and cold-rolled, giving a rolled aluminum plate. A temperature of 350 to 500° C. at the start of hot rolling is appropriate. Intermediate annealing may be carried out before or after hot rolling, or even during hot rolling. The intermediate annealing conditions may consist of 2 to 20 hours of heating at 280 to 600° C., and preferably 2 to 10 hours of heating at 350 to 500° C., in a batch-type annealing furnace, or of heating for up to 6 minutes at 400 to 600° C., and preferably up to 2 minutes at 450 to 550° C., in a continuous annealing furnace. Using a continuous annealing furnace to heat the rolled plate at a temperature rise rate of 10 to 200° C./s enables a finer crystal structure to be achieved.

The aluminum plate that has been finished by the above step to a given thickness of, say, 0.1 to 0.5 mm may then be flattened with a leveling machine such as a roller leveler or a tension leveler. Flattening may be carried out after the aluminum plate has been cut into discrete sheets. However, to enhance productivity, it is preferable to carry out such flattening with the rolled aluminum in the state of a continuous coil. The plate may also be passed through a slitter line to cut it to a predetermined width. A thin film of oil may be provided on the surface of the aluminum plate to prevent scuffing due to rubbing between adjoining aluminum plates. Suitable use may be made of either a volatile or non-volatile oil film, as needed.

Continuous casting processes that are industrially carried out include processes which use cooling rolls, such as the twin roll process (Hunter process) and the 3C process; and processes which use a cooling belt or a cooling block, such as the twin belt process (Hazelett process) and the Alusuisse Caster II process. When a continuous casting process is used, the melt is solidified at a cooling rate of 100 to 1,000° C./s. Continuous casting processes generally have a faster cooling rate than direct chill casting processes, and so are characterized by the ability to achieve a higher solid solubility of alloying ingredients in the aluminum matrix. Technology relating to continuous casting processes that has been disclosed by the present applicant is described in, for example, JP 3-79798 A, JP 5-201166 A, JP 5-156414 A, JP 6-262203 A, JP 6-122949 A, JP 6-210406 A and JP 6-26308 A.

When continuous casting is carried out, such as by a process involving the use of cooling rolls (e.g., the Hunter process), the melt can be directly and continuously cast as a plate having a thickness of 1 to 10 mm, thus making it possible to omit the hot rolling step. Moreover, when use is made of a process that employs a cooling belt (e.g., the Hazelett process), a plate having a thickness of 10 to 50 mm can be cast. Generally, by positioning a hot-rolling roll immediately after casting, the cast plate can then be successively rolled, enabling a continuously cast and rolled plate with a thickness of 1 to 10 mm to be obtained.

These continuously cast and rolled plates are then subjected to such processes as cold rolling, intermediate annealing, flattening and slitting in the same way as described above for direct chill casting, and thereby finished to a plate thickness of 0.1 to 0.5 mm, for instance. Technology disclosed by the present applicant concerning the intermediate annealing conditions and cold rolling conditions in a continuous casting process is described in, for example, JP 6-220593 A, JP 6-210308 A, JP 7-54111 A and JP 8-92709 A.

The aluminum plate used in the present invention is well-tempered in accordance with H18 defined in JIS.

It is desirable for the aluminum plate manufactured as described above to have the following properties.

For the aluminum plate to achieve the stiffness required of a lithographic printing plate support, it should have a 0.2% proof strength of preferably at least 120 MPa. To ensure some degree of stiffness even when burning treatment has been carried out, the 0.2% proof strength following 3 to 10 minutes of heat treatment at 270° C. should be preferably at least 80 MPa, and more preferably at least 100 MPa. In the case where the aluminum plate is required to have a high stiffness, use may be made of an aluminum material containing magnesium or manganese. However, because a higher stiffness lowers the ease with which the plate can be fit onto the plate cylinder of the printing press, the plate material and the amounts of minor components added thereto are suitably selected according to the intended application. Related technology disclosed by the present applicant is described in, for example, JP 7-126820 A and JP 62-140894 A.

The aluminum plate more preferably has a tensile strength of 160±15 $N/mm^2$, a 0.2% proof strength of 140±15 MPa, and an elongation as defined in JIS Z2241 and Z2201 of 1 to 10%.

Because the crystal structure at the surface of the aluminum plate may give rise to a poor surface quality when chemical graining treatment or electrochemical graining treatment is carried out, it is preferable that the crystal structure not be too coarse. The crystal structure at the surface of the aluminum plate has a width of preferably up to 200 μm, more preferably up to 100 μm, and most preferably up to 50 μm. Moreover, the crystal structure has a length of preferably up to 5,000 μm, more preferably up to 1,000 μm, and most preferably up to 500 μm. Related technology disclosed by the present applicant is described in, for example, JP 6-218495 A, JP 7-39906 A and JP 7-124609 A.

It is preferable for the alloying ingredient distribution at the surface of the aluminum plate to be reasonably uniform because non-uniform distribution of alloying ingredients at the surface of the aluminum plate sometimes leads to a poor surface quality when chemical graining treatment or electrochemical graining treatment is carried out. Related technology disclosed by the present applicant is described in, for example, JP 6-48058 A, JP 5-301478 A and JP 7-132689 A.

The size or density of intermetallic compounds in an aluminum plate may affect chemical graining treatment or electrochemical graining treatment. Related technology disclosed by the present applicant is described in, for example, JP 7-138687 A and JP 4-254545 A.

Presensitized Plate

A presensitized plate of the present invention can be obtained from the lithographic printing plate support described above by providing on the support the recording layer capable of recording, developing and printing an image, a character or the like. A photosensitive and thermosensitive composition is used in the recording layer.

Preferred examples of photosensitive compositions that may be used in the present invention include thermal positive-type photosensitive compositions containing an alkali-soluble polymeric compound and a photothermal conversion substance (such compositions and the recording layers obtained using these compositions are referred to below as "thermal positive-type" compositions and recording layers), thermal negative-type photosensitive compositions containing a curable compound and a photothermal conversion substance (these compositions and the recording layers obtained therefrom are similarly referred to below as "thermal negative-type" compositions and recording layers), photopolymerizable photosensitive compositions (referred to below as "photopolymer-type" compositions), negative-type photosensitive compositions containing a diazo resin or a photo-crosslinkable resin (referred to below as "conventional negative-type" compositions), positive-type photosensitive compositions containing a quinonediazide compound (referred to below as "conventional positive-type" compositions), and photosensitive compositions that do not require a special development step (referred to below as "non-treatment type" compositions). The thermal positive-type, thermal negative-type and non-treatment type compositions are particularly preferred. These preferred photosensitive compositions are described below.

The presensitized plate of the present invention has a recording layer formed on the lithographic printing plate support, and the recording layer preferably has a weight per unit area of 1.1 to 1.6 $g/m^2$, more preferably 1.1 to 1.5 $g/m^2$, and even more preferably 1.1 to 1.4 $g/m^2$. The weight of the recording layer is determined based on the weight change per unit area after the composition for the recording layer has been applied and dried.

The scratch resistance is further enhanced by providing the recording layer whose weight per unit area falls within the above ranges on the support of the present invention having a specific surface profile.

Thermal Positive-Type Photosensitive Compositions

Photosensitive Layer

Thermal positive-type photosensitive compositions contain an alkali-soluble polymeric compound and a photothermal conversion substance. In a thermal positive-type image recording layer, the photothermal conversion substance converts light energy such as from an infrared laser into heat, which efficiently eliminates interactions that lower the alkali solubility of the alkali-soluble polymeric compound.

The alkali-soluble polymeric compound may be, for example, a resin having an acidic group on the molecule, or a mixture of two or more such resins. Resins having an acidic group, such as a phenolic hydroxy group, a sulfonamide group ($—SO_2NH—R$, wherein R is a hydrocarbon group) or an active imino group ($—SO_2NHCOR$, $—SO_2NHSO_2R$ or $—CONHSO_2R$, wherein R is as defined above), are especially preferred on account of their solubility in alkaline developers.

For an excellent image formability with exposure to light from an infrared laser, for example, resins having phenolic hydroxy groups are especially desirable. Preferred examples of such resins include novolak resins such as phenol-formaldehyde resins, m-cresol-formaldehyde resins, p-cresol-formaldehyde resins, cresol-formaldehyde resins in which the cresol is a mixture of m-cresol and p-cresol, and phenol/cresol mixture-formaldehyde resins (phenol-cresol-formaldehyde co-condensation resins) in which the cresol is m-cresol, p-cresol or a mixture of m- and p-cresol.

Additional preferred examples include the polymeric compounds described in JP 2001-305722 A (especially paragraphs [0023] to [0042]), the polymeric compounds having recurring units of general formula (1) described in JP 2001-215693 A, and the polymeric compounds described in JP 2002-311570 A (especially paragraph [0107]).

To provide a good recording sensitivity, the photothermal conversion substance is preferably a pigment or dye that absorbs light in the infrared wavelength range of 700 to 1200 nm. Illustrative examples of suitable dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal-thiolate complexes (e.g., nickel-thiolate complexes). Of these, cyanine dyes are preferred. The cyanine dyes of general formula (I) described in JP 2001-305722 A are especially preferred.

A dissolution inhibitor may be included in thermal positive-type photosensitive compositions. Preferred examples of dissolution inhibitors include those described in paragraphs [0053] to [0055] of JP 2001-305722 A.

The thermal positive-type photosensitive compositions preferably also include, as additives, sensitivity regulators, print-out agents for obtaining a visible image immediately after heating from light exposure, compounds such as dyes as image colorants, and surfactants for enhancing coatability and treatment stability. Compounds such as described in paragraphs [0056] to [0060] of JP 2001-305722 A are preferred additives.

Use of the photosensitive compositions described in detail in JP 2001-305722 A is desirable because of the above preferred components and additional advantages.

The thermal positive-type image recording layer is not limited to a single layer, but may have a two-layer construction.

Preferred examples of image recording layers with a two-layer construction (also referred to as "multilayer-type image recording layers") include those comprising a bottom layer ("layer A") of excellent press life and solvent resistance which is provided on the side close to the support and a layer ("layer B") having an excellent positive-image formability which is provided on layer A. This type of image recording layer has a high sensitivity and can provide a broad development latitude. Layer B generally contains a photothermal conversion substance. Preferred examples of the photothermal conversion substance include the dyes mentioned above.

Preferred examples of resins that may be used in layer A include polymers that contain as a copolymerizable component a monomer having a sulfonamide group, an active imino group or a phenolic hydroxy group; such polymers have an excellent press life and solvent resistance. Preferred examples of resins that may be used in layer B include phenolic hydroxy group-bearing resins which are soluble in alkaline aqueous solutions.

In addition to the above resins, various additives may be included, if necessary, in the compositions used to form layers A and B. For example, suitable use can be made of the additives described in paragraphs [0062] to [0085] of JP 2002-323769 A. The additives described in paragraphs [0053] to [0060] of JP 2001-305722 A as above are also suitable for use.

The components and proportions thereof in each of layers A and B are preferably selected as described in JP 11-218914 A.

Intermediate Layer

It is advantageous to provide an intermediate layer between the thermal positive-type image recording layer and the support. Preferred examples of ingredients that may be used in the intermediate layer include the various organic compounds described in paragraph [0068] of JP 2001-305722 A.

Others

The methods described in detail in JP 2001-305722 A may be used to form a thermal positive-type image recording layer and to make a printing plate having such a layer.

Thermal Negative-Type Photosensitive Compositions

Thermal negative-type photosensitive compositions contain a curable compound and a photothermal conversion substance. A thermal negative-type image recording layer is a negative-type photosensitive layer in which areas irradiated with light such as from an infrared laser cure to form image areas.

Polymerizable Layer

An example of a preferred thermal negative-type image recording layer is a polymerizable image recording layer (polymerizable layer). The polymerizable layer contains a photothermal conversion substance, a radical generator, a radical-polymerizable compound which is a curable compound, and a binder polymer. In the polymerizable layer, the photothermal conversion substance converts absorbed infrared light into heat, and the heat decomposes the radical generator, thereby generating radicals. The radicals then trigger the chain polymerization and curing of the radical-polymerizable compound.

Illustrative examples of the photothermal conversion substance include photothermal conversion substances that may be used in the above-described thermal positive-type photosensitive compositions. Specific examples of cyanine dyes, which are especially preferred, include those described in paragraphs [0017] to [0019] of JP 2001-133969 A.

Preferred radical generators include onium salts. The onium salts described in paragraphs [0030] to [0033] of JP 2001-133969 A are especially preferred.

Exemplary radical-polymerizable compounds include compounds having one, and preferably two or more, terminal ethylenically unsaturated bonds.

Preferred binder polymers include linear organic polymers. Linear organic polymers which are soluble or swellable in water or a weakly alkaline aqueous solution are preferred. Of these, (meth)acrylic resins having unsaturated groups (e.g., allyl, acryloyl) or benzyl groups and carboxy groups in side chains are especially preferred because they provide an excellent balance of film strength, sensitivity and developability.

Radical-polymerizable compounds and binder polymers that may be used include those described specifically in paragraphs to [0060] of JP 2001-133969 A.

Thermal negative-type photosensitive compositions preferably contain additives described in paragraphs [0061] to [0068] of JP 2001-133969 A (e.g., surfactants for enhancing coatability).

The methods described in detail in JP 2001-133969 A may be used to form a polymerizable layer and to make a printing plate having such a layer.

Acid-crosslinkable Layer

Another preferred thermal negative-type image recording layer is an acid-crosslinkable image recording layer (abbreviated hereinafter as "acid-crosslinkable layer"). An acid-crosslinkable layer contains a photothermal conversion substance, a thermal acid generator, a compound (crosslinker) which is curable and which crosslinks under the influence of an acid, and an alkali-soluble polymeric compound which is capable of reacting with the crosslinker in the presence of an acid. In an acid-crosslinkable layer, the photothermal conversion substance converts absorbed infrared light into heat. The heat decomposes the thermal acid generator, thereby generating an acid which causes the crosslinker and the alkali-soluble polymeric compound to react and cure.

The photothermal conversion substance is exemplified by the same substances as can be used in the polymerizable layer.

Exemplary thermal acid generators include photoinitiators for photopolymerization, dye photochromogenic substances, and heat-decomposable compounds such as acid generators which are used in microresists and the like.

Exemplary crosslinkers include hydroxymethyl- or alkoxymethyl-substituted aromatic compounds, compounds having N-hydroxymethyl, N-alkoxymethyl or N-acyloxymethyl groups, and epoxy compounds.

Exemplary alkali-soluble polymeric compounds include novolak resins and polymers having hydroxyaryl groups in side chains.

Photopolymer-Type Photosensitive Compositions

Photopolymer-type photosensitive compositions contain an addition-polymerizable compound, a photopolymerization initiator and a polymer binder.

Preferred addition-polymerizable compounds include compounds containing an ethylenically unsaturated bond which are addition-polymerizable. Ethylenically unsaturated bond-containing compounds are compounds which have a terminal ethylenically unsaturated bond. Such compounds may have the chemical form of a monomer, a prepolymer, or a mixture thereof. The monomers are exemplified by esters of unsaturated carboxylic acids (e.g., acrylic acid, methacrylic acid, itaconic acid, maleic acid) and aliphatic polyols, and amides of unsaturated carboxylic acids and aliphatic polyamines.

Preferred addition-polymerizable compounds include also urethane-type addition-polymerizable compounds.

The photopolymerization initiator may be any of various photopolymerization initiators or a system of two or more photopolymerization initiators (photoinitiation system) which is suitably selected according to the wavelength of the light source to be used. Preferred examples include the initiation systems described in paragraphs [0021] to [0023] of JP 2001-22079 A.

The polymer binder, inasmuch as it must function as a film-forming agent for the photopolymerizable photosensitive composition and, at the same time, must allow the image recording layer to dissolve in an alkaline developer, should be an organic polymer which is soluble or swellable in an alkaline aqueous solution. Preferred examples of such organic polymers include those described in paragraphs [0036] to [0063] of JP 2001-22079 A.

It is preferable for the photopolymer-type photosensitive composition to include the additives described in paragraphs to [0088] of JP 2001-22079 A (e.g., surfactants for improving coatability, colorants, plasticizers, thermal polymerization inhibitors).

To prevent the inhibition of polymerization by oxygen, it is preferable to provide an oxygen-blocking protective layer on top of the photopolymer-type image recording layer. The polymer present in the oxygen-blocking protective layer is exemplified by polyvinyl alcohols and copolymers thereof.

It is also desirable to provide an intermediate layer or a bonding layer like those described in paragraphs [0124] to [0165] of JP 2001-228608 A.

Conventional Negative-Type Photosensitive Compositions

Conventional negative-type photosensitive compositions contain a diazo resin or a photo-crosslinkable resin. Among others, photosensitive compositions which contain a diazo resin and an alkali-soluble or swellable polymeric compound (binder) are preferred.

The diazo resin is exemplified by condensation products of an aromatic diazonium salt with an active carbonyl group-bearing compound such as formaldehyde; and organic solvent-soluble diazo resin inorganic salts which are the reaction products of a hexafluorophosphate or tetrafluoroborate with the condensation product of a p-diazophenylamine and formaldehyde. The high-molecular-weight diazo compounds described in JP 59-78340 A, in which the content of hexamer and larger polymers is at least 20 mol %, are especially preferred.

Exemplary binders include copolymers containing acrylic acid, methacrylic acid, crotonic acid or maleic acid as an essential component. Specific examples include the multi-component copolymers of such monomers as 2-hydroxyethyl (meth)acrylate, (meth)acrylonitrile and (meth)acrylic acid described in JP 50-118802 A, and the multi-component copolymers of alkyl acrylates, (meth)acrylonitrile and unsaturated carboxylic acids described in JP 56-4144 A.

Conventional negative-type photosensitive compositions preferably contain as additives the print-out agents, dyes, plasticizers for imparting flexibility and wear resistance to the applied coat, development promoters and other compounds, and the surfactants for enhancing coatability described in paragraphs [0014] to [0015] of JP 7-281425 A.

Below the conventional negative-type photosensitive layer, it is advantageous to provide the intermediate layer which contains a polymeric compound having an acid group-bearing component and an onium group-bearing component described in JP 2000-105462 A.

Conventional Positive-Type Photosensitive Compositions

Conventional positive-type photosensitive compositions contain a quinonediazide compound. Photosensitive compositions containing an o-quinonediazide compound and an alkali-soluble polymeric compound are especially preferred.

Illustrative examples of the o-quinonediazide compound include esters of 1,2-naphthoquinone-2-diazido-5-sulfonylchloride and a phenol-formaldehyde resin or a cresol-formaldehyde resin, and the esters of 1,2-naphthoquinone-2-diazido-5-sulfonylchloride and pyrogallol-acetone resins described in U.S. Pat. No. 3,635,709.

Illustrative examples of the alkali-soluble polymeric compound include phenol-formaldehyde resins, cresol-formaldehyde resins, phenol-cresol-formaldehyde co-condensation resins, polyhydroxystyrene, N-(4-hydroxyphenyl)methacrylamide copolymers, the carboxy group-bearing polymers described in JP 7-36184 A, the phenolic hydroxy group-bearing acrylic resins described in JP 0.51-34711 A, the sulfonamide group-bearing acrylic resins described in JP 2-866 A, and urethane resins.

Conventional positive-type photosensitive compositions preferably contain as additives the compounds such as sensitivity regulators, print-out agents and dyes described in paragraphs [0024] to [0027] of JP 7-92660 A, and surfactants for enhancing coatability such as are described in paragraph [0031] of JP 7-92660 A.

Below the conventional positive-type photosensitive layer, it is advantageous to provide an intermediate layer similar to the intermediate layer which is preferably used in the case of the conventional negative-type photosensitive layer as above.

Non-Treatment Type Photosensitive Compositions

Illustrative examples of non-treatment type photosensitive compositions include thermoplastic polymer powder-based photosensitive compositions, microcapsule-based photosensitive compositions, and sulfonic acid-generating polymer-containing photosensitive compositions. All of these are heat-sensitive compositions containing a photothermal conversion substance. The photothermal conversion substance is preferably a dye of the same type as those which can be used in the above-described thermal positive-type photosensitive compositions.

Thermoplastic polymer powder-based photosensitive compositions are composed of a hydrophobic, heat-meltable finely divided polymer dispersed in a hydrophilic polymer matrix. In the thermoplastic polymer powder-based image recording layer, the fine particles of hydrophobic polymer melt under the influence of heat generated by light exposure and mutually fuse, forming hydrophobic regions which serve as the image areas.

The finely divided polymer is preferably one in which the particles melt and fuse together under the influence of heat. A finely divided polymer in which the individual particles have a hydrophilic surface, enabling them to disperse in a hydrophilic component such as fountain solution, is especially preferred. Preferred examples include the finely divided thermoplastic polymers described in Research Disclosure No. 33303 (January 1992), JP 9-123387 A, JP 9-131850 A, JP 9-171249 A, JP 9-171250 A and EP 931,647. Of these, polystyrene and polymethyl methacrylate are preferred. Illustrative examples of finely divided polymers having a hydrophilic surface include those in which the polymer itself is hydrophilic, and those in which the surfaces of the polymer particles have been rendered hydrophilic by adsorbing thereon a hydrophilic compound such as polyvinyl alcohol or polyethylene glycol.

The finely divided polymer preferably has reactive functional groups.

Preferred examples of microcapsule-type photosensitive compositions include those described in JP 2000-118160 A, and compositions like those described in JP 2001-277740 A in which a compound having thermally reactive functional groups is enclosed within microcapsules.

Illustrative examples of sulfonic acid-generating polymers that may be used in sulfonic acid generating polymer-containing photosensitive compositions include the polymers described in JP 10-282672 A that have sulfonate ester groups, disulfone groups or sec- or tert-sulfonamide groups in side chains.

Including a hydrophilic resin in a non-treatment type photosensitive composition not only provides a good on-press developability, it also enhances the film strength of the photosensitive layer itself. Preferred hydrophilic resins include resins having hydrophilic groups such as hydroxy, carboxy, hydroxyethyl, hydroxypropyl, amino, aminoethyl, aminopropyl or carboxymethyl groups; and hydrophilic binder resins of a sol-gel conversion-type.

A non-treatment type image recording layer can be developed on the press, and thus does not require a special development step. The methods described in detail in JP 2002-178655 A may be used as the method of forming a non-treatment type image recording layer and the associated plate making and printing methods.

Back Coat

If necessary, the presensitized plate of the invention obtained by providing any of the various above image recording layers on a lithographic printing plate support obtained according to the invention may be provided on the rear side with a coat composed of an organic polymeric compound to prevent scuffing of the image recording layer when the presensitized plates are stacked on top of each other.

Lithographic Plate Making Process

The presensitized plate prepared using a lithographic printing plate support obtainable according to the invention is then subjected to any of various treatment methods depending on the type of the image recording layer, thereby obtaining a lithographic printing plate.

Illustrative examples of sources of actinic light that may be used for imagewise exposure include mercury vapor lamps, metal halide lamps, xenon lamps and chemical lamps. Examples of laser beams that may be used include those from helium-neon lasers (He—Ne lasers), argon lasers, krypton lasers, helium-cadmium lasers, KrF excimer lasers, semiconductor lasers, YAG lasers and YAG-SHG lasers.

Following the above exposure, if the image recording layer is of a thermal positive type, thermal negative type, conventional negative type, conventional positive type or photopolymer type, it is preferable to carry out development using a developer in order to prepare a lithographic printing plate.

The developer is preferably an alkaline developer, and more preferably an alkaline aqueous solution which is substantially free of organic solvent.

Developers which are substantially free of alkali metal silicates are also preferred. One example of a suitable method of development using a developer which is substantially free of alkali metal silicates is the method described in detail in JP 11-109637 A.

Developers which contain an alkali metal silicate may also be used.

EXAMPLES

Hereinafter, the present invention is described in detail by way of examples. However, the present invention is not limited thereto.

1. Fabirication of Lithographic Printing Plate Support

Examples 1-15 and Comparative Examples 1-5

Lithographic printing plate supports in Examples 1-15 and Comparative Examples 1-5 were obtained according to the method described below.

Fabrication of Aluminum Plate

A melt was prepared from an aluminum alloy composed of 0.06 wt % silicon, 0.30 wt % iron, 0.005 wt % copper, 0.001 wt % manganese, 0.001 wt % magnesium, 0.001 wt % zinc and 0.03 wt % titanium, with the balance being aluminum and inadvertent impurities. The aluminum alloy melt was subjected to molten metal treatment and filtration, then was cast into a 500 mm thick, 1,200 mm wide ingot by a direct chill casting process. The ingot was scalped with a scalping machine, removing on average 10 mm of material from the surface, then soaked and held at 550° C. for about 5 hours. When the temperature had fallen to 400° C., the ingot was rolled with a hot rolling mill to a plate thickness of 2.7 mm. In addition, heat treatment was carried out at 500° C. in a continuous annealing furnace, after which cold rolling was carried out to finish the aluminum plate to a thickness of 0.24 mm thereby obtaining a JIS 1050 aluminum plate.

The aluminum plate was cut to a width of 1030 mm and then subjected to surface treatments described below.

Examples 1-13 and Comparative Examples 2-5

Surface Treatment

The aluminum plates were successively subjected to the following surface treatments (a) to (j). Note that nip rollers were used to remove the solution or water after each treatment or rinsing treatment was carried out.

(a) Mechanical Graining Treatment (Brush Graining)

The apparatus as shown in FIG. 5 was used to carry out mechanical graining treatment which involved rotating nylon roller brushes while an aqueous suspension containing an abrasive (pumice; mean particle size of 30 μm, $SiO_2$ content of 73 wt %) (specific gravity: 1.1 g/cm$^3$) was supplied to the surface of each aluminum plate as the abrasive slurry. In FIG. 5, reference numeral 1 is an aluminum plate and reference numeral 2 is a roller brush (brush made of No. 3 nylon, brush having bundles of bristles implanted in its outer periphery). The nylon brush was made of nylon 6.10 and had a bristle length of 50 mm and a bristle diameter of 0.3 mm. For the nylon brush, the bristles were tightly packed in holes formed in a stainless steel cylinder having a diameter of 400 mm. Actually, three rotating brushes were used although only two brushes were shown in FIG. 5. The distance between the two support rollers (diameter: 200 mm) under each of the brushes was 300 mm. The roller brushes were pressed against an aluminum plate until the load of the drive motor for rotating the brushes increased by 10 kW from the state in which the roller brushes had not yet been pressed against the aluminum plate. The rotation direction of the brush in the portion where the brush contacts the aluminum plate was the same as the direction in which the aluminum plate was moved. The brushes were rotated at 150 rpm.

(b) First Etching

Etching was carried out by spraying each aluminum plate obtained above with an aqueous solution having a sodium hydroxide concentration of 26 wt %, an aluminum ion concentration of 5 wt % and a temperature of 60° C. The amount of material removed by etching from the surface of each aluminum plate was set to be 10 g/m$^2$.

Then, each aluminum plate was sprayed with water for rinsing.

(c) First Desmutting

Desmutting was carried out by spraying each aluminum plate with an aqueous solution having a sulfuric acid concentration of 1 wt %, an aluminum ion concentration of 4.5 g/L and a temperature of 35° C. for 10 seconds from a spray line. Thereafter, each aluminum plate was sprayed with water for rinsing. Wastewater from the solution used in the first electrochemical graining treatment was used in the first desmutting.

(d) First Electrochemical Graining (First Electrolysis)

A square wave alternating current with a frequency of 60 Hz was continuously passed through each aluminum plate to carry out electrochemical graining treatment. An aqueous solution containing 1 wt % of nitric acid (, 4.5 wt % of aluminum ions and 80 ppm of ammonium ions) was used as the electrolyte solution at a temperature of 35° C. Ferrite was used for the auxiliary anode. The electrolytic cell as shown in FIG. 3 was used. The total amount of electricity when the aluminum plate served as an anode was 220 C/dm$^2$. The current density during the anodic reaction on each aluminum plate at the alternating current peaks was 25 A/dm$^2$. Then, each aluminum plate was sprayed with water for rinsing.

(e) Second Etching

Etching was carried out by spraying each aluminum plate obtained above with an aqueous solution having a sodium hydroxide concentration of 26 wt %, an aluminum ion concentration of 5 wt % and a temperature of 60° C., whereby the aluminum hydroxide-based smut component generated when electrochemical graining treatment was carried out using the alternating current in the previous step was removed, and edges of pits formed by the first electrochemical graining treatment were dissolved and given smooth surfaces. The amount of material removed by etching from the surface of each aluminum plate was 0.2 g/dm$^2$.

Then, each aluminum plate was sprayed with water for rinsing.

(f) Second Desmutting

Desmutting was carried out by spraying each aluminum plate with an aqueous solution having a sulfuric acid concentration of 30 wt %, an aluminum ion concentration of 1 wt % and a temperature of 35° C. for 10 seconds from a spray line. Then, each aluminum plate was sprayed with water for rinsing.

(g) Second Electrochemical Graining (Second Electrolysis)

A square wave alternating current with a frequency of 60 Hz was continuously passed through each aluminum plate to carry out electrochemical graining treatment. An aqueous solution containing 5 g/L of hydrochloric acid (and 4.5 wt % of aluminum ions) was used as the electrolyte solution at a temperature of 35° C. Ferrite was used for the auxiliary anode. The electrolytic cell as shown in FIG. 3 was used. The total amount of electricity when the aluminum plate served as an anode was as shown in Table 1. The current density during the anodic reaction on each aluminum plate at the alternating current peaks was 25 A/dm$^2$.

Then, each aluminum plate was sprayed with water for rinsing.

(h) Third Etching

Etching was carried out by spraying each aluminum plate with an aqueous solution having a sodium hydroxide concentration of 26 wt % and an aluminum ion concentration of 5 wt % at a temperature of 60° C., whereby each aluminum plate was dissolved. The aluminum hydroxide-based smut component generated when electrochemical graining treatment was carried out using the alternating current in the previous step was removed, and edges of pits formed by the second electrochemical graining treatment were dissolved and given smooth surfaces. The amount of material removed by etching from the surface of each aluminum plate was as shown in Table 1.

Then, each aluminum plate was sprayed with water for rinsing.

(i) Third Desmutting

Desmutting was carried out by spraying each aluminum plate with an aqueous solution having a sulfuric acid concentration of 30 wt %, an aluminum ion concentration of 1 wt % and a temperature of 35° C. for 10 seconds from a spray line. Then, each aluminum plate was sprayed with water for rinsing.

(j) Anodizing Treatment

An anodizing apparatus of the structure as shown in FIG. 4 was used to carry out anodizing treatment to obtain a lithographic printing plate support in Example 1. Sulfuric acid was used for the electrolyte solution for supplying to the anodizing treatment tank. Each electrolyte solution contained 15 wt % of sulfuric acid (and 1 wt % of aluminum ions) and had a temperature of 35° C. Then, each aluminum plate was sprayed with water for rinsing. The final weight of the anodized layer was 2.4 g/m$^2$.

Example 14

The surface treatments described above were carried out except that the treatment (a) was replaced by the treatment (a-1) described below.

(a-1) Transfer of Recesses and Protrusions (Graining through Transfer)

An ingot obtained by direct chill casting was rolled to prepare a rolled aluminum plate. In the final cold rolling step, a mill roll having recesses and protrusions formed on the surface thereof was brought into pressure contact with the rolled aluminum plate to transfer the pattern of the recesses and protrusions thereby obtaining an aluminum plate on the surface of which the recesses and protrusions were formed. The aluminum plate had a thickness of 0.3 mm and a width of 1060 mm. In order to obtain the mill roll having recesses and protrusions formed on the surface thereof, alumina having a mean particle size of 80 μm was used for the grit to carry out air blasting twice to thereby form the recesses and protrusions on the surface of a steel roll and its surface was hardened by hard chromium plating.

Example 15

The surface treatments described above were carried out except that the treatments (a) and (b) were replaced by the treatments (a-2) and (b'), respectively.

(a-2) Electrochemical Graining (Hydrochloric Acid Electrolysis)

Figure 2:
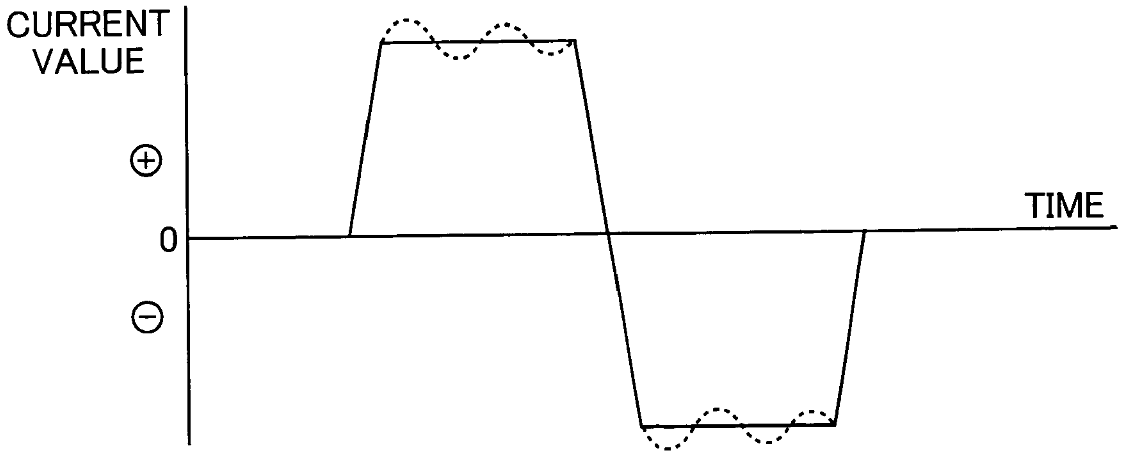
FIG. 2 is a graph showing an example of an alternating current waveform that is used in a second electrochemical graining treatment in the method of manufacturing a lithographic printing plate support according to the present invention.

An alternating current with a frequency of 60 Hz was used to continuously carry out electrochemical graining treatment. The solution temperature was 35° C. The alternating current from the AC power supply had a waveform as shown in FIG. 2. The time TP until the current reached a peak from zero was 0.8 msec and the duty ratio was 1:1. An alternating current having a trapezoidal waveform was passed through each aluminum plate using carbon electrodes for the counter electrode, thereby carrying out electrochemical graining treatment. Ferrite was used for the auxiliary anode. The electrolytic cell as shown in FIG. 3 was used.

The current density at the mean current value was 25 $A/dm^2$.

An aqueous solution containing 1 wt % (10 g/L) of hydrochloric acid (and 0.5 wt % of aluminum ions) was used as the electrolyte solution in the hydrochloric acid electrolysis. Hydrochloric acid electrolysis was carried out for 16 seconds. The total amount of electricity in hydrochloric acid electrolysis when the aluminum plate served as an anode was 400 $C/dm^2$.

Then, each aluminum plate was sprayed with water for rinsing.

(b') First Etching

Etching was carried out by spraying each aluminum plate obtained above with an aqueous solution having a sodium hydroxide concentration of 26 wt %, an aluminum ion concentration of 5 wt % and a temperature of 60° C. The amount of material removed by etching from the surface of each aluminum plate was 3 $g/m^2$.

Then, each aluminum plate was sprayed with water for rinsing.

Comparative Example 1

The surface treatments carried out in Example 1 were repeated except the treatment (a) to obtain a lithographic printing plate support in Comparative Example 1.

2. Calculation of Factors for Surface Profile of Lithographic Printing Plate Support For the surface of each of the lithographic printing plate supports obtained by the above treatments, the arithmetic mean roughness $R_a$, the number of recesses with a depth of at least 4 μm, and the surface area ratio A (AFM specific surface area) were determined according to the procedures described below. Results are shown in Table 1.

(a) Measurement of Arithmetic Mean Roughness $R_a$

First, two-dimensional surface roughness measurement was carried out using a stylus-type surface roughness tester (e.g., Surfcom 575, available from Tokyo Seimitsu Co., Ltd.) to determine the arithmetic mean roughness $R_a$ as defined in ISO 4287.

Conditions for the two-dimensional surface roughness measurement were described below.

Measurement Conditions

Cutoff value, 0.8 mm; slope correction, FLAT-ML; measurement length, 3 mm; longitudinal magnification, 10,000×; scan rate, 0.3 mm/s; stylus tip diameter, 2 μm.

(b) Number of Recesses with a Depth of at Least 4 μm

A laser microscope (Micromap 520 manufactured by Ryoka Systems Inc.) was used to scan a 400 μm square region on the surface of each support in a non-contact state with a resolution of 0.01 μm to determine three-dimensional data. The number of recesses with a depth of at least 4 μm was counted in the three-dimensional data to obtain the number of recesses.

Measurement was carried out at five points and the average of the measurements was determined. Results are shown in Table 1.

(c) Measurement of Surface Area Ratio $\Delta S^{5(0.02\text{-}0.2)}$

The surface profile was measured with an atomic force microscope (SPA 300/SPI3800N manufactured by Seiko Instruments Inc.) to determine three-dimensional data f(x,y).

A 1 cm square sample was cut out from each lithographic printing plate support and placed on a horizontal sample holder on a piezo scanner. A cantilever was made to approach the surface of the sample. When the cantilever reached the zone where interatomic forces were appreciable, the surface of the sample was scanned in the X and Y directions and the surface topography of the sample was read based on the displacement in the Z direction. The piezo scanner used was capable of scanning 150 μm in the X and Y directions and 10 μm in the Z direction. The cantilever used had a resonance frequency of 120 to 400 kHz and a spring constant of 12 to 90 N/m (SI-DF20 manufactured by Seiko Instruments Inc.). Measurement was carried out in the dynamic force mode (DFM). The three-dimensional data obtained was approximated by the least-squares method to compensate for slight tilting of the sample and determine a reference plane.

Measurement involved obtaining values of 5 μm square regions of the surface of the sample at 512 by 512 points. The resolution was 0.01 μm in the X and Y directions, and 0.15 nm in the Z direction, and the scan rate was 5 μm/s.

Next, components having a wavelength in the range of 0.02 μm to 0.2 μm were extracted from the obtained three-dimensional data f(x,y). These components were extracted by performing a fast Fourier transform on the three-dimensional data f(x,y) to determine a frequency distribution, removing components having a wavelength of less than 0.02 μm and those having a wavelength exceeding 0.2 μm, and performing an inverse Fourier transform.

Three-dimensional data g(x,y) obtained by extraction was used to extract sets of adjacent three points. The surface areas of microtriangles formed by the sets of three points was summated, thereby giving the actual surface area $S_x^{5(0.02\text{-}0.2)}$. The surface area ratio $\Delta S^{5(0.02\text{-}0.2)}$ was then calculated from the resulting actual surface area $S_x^{5(0.02\text{-}0.2)}$ and the geometri cally measured surface area $S_0$ using the following equation (1).

$$S^{5(0.02\text{-}0.2)}(\%)=[(S_x^{5(0.02\text{-}0.2)}S_0)/S_0]\times 100(\%) \quad (1)$$

(d) Measurement of Weight of Recording Layer

A solution for the recording layer to be described later was applied onto each of the lithographic printing plate supports and dried. Then, each support was cut into a sample having a surface area of 1 $dm^2$ and the weight of each sample was measured. Thereafter, the recording layer was removed from each sample using a solvent (MEK, γ-BL). Each sample was dried and its weight was measured. The weight of the recording layer per unit area of the support was calculated from the difference between the two weights. Results are shown in Table 1.

3. Fabrication of Presensitized Plate

Presensitized plates for lithographic printing were fabricated by providing a thermal positive-type image recording layer in the manner described below on each of the lithographic printing plate supports obtained above. Before providing the image recording layer, an undercoat was formed on each support as follows.

An undercoating solution of the composition indicated below was applied onto each lithographic printing plate support and dried at 80° C. for 15 seconds, thereby forming an undercoat layer. The weight of the undercoat layer after drying was 15 $mg/m^2$.

| <Composition of Undercoating Solution> | |
|---|---|
| Polymeric compound of the following formula | 0.3 g |
| 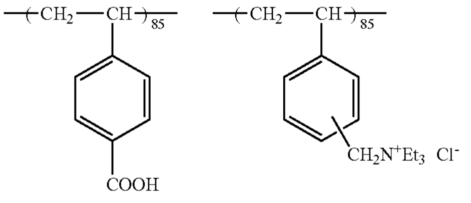 molecular weight, 28,000 | |
| Methanol | 100 g |
| Water | 1 g |

In addition, a heat-sensitive layer-forming coating solution of the following composition was prepared. The heat-sensitive layer-forming coating solution was applied onto each undercoated lithographic printing plate support to a coating weight after drying (heat-sensitive layer coating weight) as shown in Table 1 and dried so as to form a heat-sensitive layer (thermal positive-type image recording layer), thereby giving each presensitized plate.

| <Composition of Heat Sensitive Layer-Forming Coating Solution> | |
|---|---|
| Novolak resin (m-cresol/p-cresol = 60/40; weight-average molecular weight, 7,000; unreacted cresol content, 0.5 wt %) | 0.90 g |
| Ethyl methacrylate/isobutyl methacrylate/methacrylic acid copolymer (molar ratio, 35/35/30) | 0.10 g |
| Cyanine dye A of the following formula | 0.1 g |
| 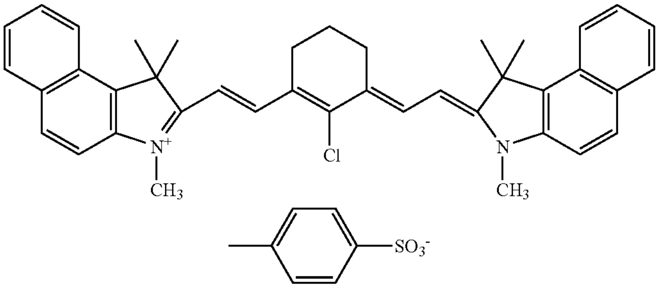 Cyanine Dye A | |
| Tetrahydrophthalic anhydride | 0.05 g |
| p-Toluenesulfonic acid | 0.002 g |
| Ethyl violet in which counterion was changed to 6-hydroxy-β-naphthalenesulfonic acid | 0.02 g |
| Fluorochemical surfactant (Megaface F-780F, available from Dainippon Ink and Chemicals, Inc.; 30 wt % solids) | 0.0045 g (solids) |
| Fluorochemical surfactant (Megaface F-781F, available from Dainippon Ink and Chemicals, Inc., 100 wt % solids) | 0.035 g |
| Methyl ethyl ketone | 12 g |

4. Evaluation of Presensitized Plate

The presensitized plates were evaluated for the press life, scumming resistance and scratch resistance according to the following methods.

(1) Press Life

The Trendsetter platesetter manufactured by Creo was used to form an image on each of the presensitized plates at a drum rotation speed of 150 rpm and a beam intensity of 10 W.

Thereafter, the PS Processor 940H manufactured by Fuji Photo Film Co., Ltd. that was charged with an alkaline developer of the composition described below was used to develop the presensitized plates for 20 seconds while the developer was maintained at 30° C., whereby lithographic printing plates were obtained.

| <Composition of Alkaline Developer> | |
|---|---|
| D-sorbit | 2.5 wt % |
| Sodium hydroxide | 0.85 wt % |
| Polyethyleneglycol lauryl ether (weight-average molecular weight 1,000) | 0.5 wt % |
| Water | 96.15 wt % |

Each of the obtained lithographic printing plates was set on the Lithrone printing press (manufactured by Komori Corporation) to carry out printing using DIC-GEOS(N) black ink available from Dainippon Ink and Chemicals, Inc. Press life was evaluated by the number of copies that were printed up until the density of solid images began to decline on visual inspection. The number of copies in excess of 40,000 is preferable.

Results are shown in Table 2.

(2) Scumming Resistance

Each of the lithographic printing plates obtained in the same manner as in the evaluation of press life in (1) above was set on the Mitsubishi DAIYA F2 printing press (manufactured by Mitsubishi Heavy Industries, Ltd.) to carry out printing using DIC-GEOS (s) magenta ink. Each of the lithographic printing plates was evaluated for the scumming resistance by visually inspecting the blanket for stains after 10,000 copies had been printed up.

Results are shown in Table 1. In Table 1, each plate was evaluated based on the following seven criteria:

A: few stains on the blanket;

B: between A and C;

C: a few stains on the blanket;

D: between C and E;

E: the blanket is stained within a tolerable level;

F: between E and G; and

G: the whole surface of the blanket is stained.

(3) Scratch Resistance (Resistance to Scratching; Evaluation was Made by Performing a Transportation Test in the Form of a Package Without Interleaving Paper)

For each of the produced infrared-sensitive presensitized plates, 30 samples each having a size of 1030 mm×800 mm were prepared by cutting. These 30 samples were stacked on top of each other without using interleaving paper and interposed between the upper and lower cardboards having a thickness of 0.5 mm. The four corners were taped and the samples were wrapped in aluminum kraft paper. The wrapped samples were then packed in a cardboard box and taped to obtain a package without interleaving paper. The package was palletized and was allowed to travel 2000 km by truck. Thereafter, the package was opened and the samples were developed in an automatic processor LP-940HII manufactured by Fuji Photo Film Co., Ltd. that was charged with the developer DT-2 available from Fuji Photo Film Co., Ltd. at a ratio of 1:8. The developed samples were evaluated to determine whether the transportation caused dropouts in the image areas.

The samples were evaluated based on the following seven criteria: When the image areas had no dropouts at all, the sample was rated as A; when almost the entire support was seen and the color of the thermosensitive layer was hardly seen, the sample was rated as G; and the intermediate levels between A and G were represented by B, C, D, E and F in order of decreasing quality.

Results are shown in Table 2.

(4) Sensitivity

The non-image area of each of the lithographic printing plates obtained in the same manner as in the evaluation of press life above was observed with a 20× loupe and evaluated to determine to what degree the image recording layer remained on the support based on the following seven criteria:

Results are shown in Table 2. In Table 2, the following criteria were used for evaluation.

A: the image recording layer does not remain;

B: between A and C;

C: almost the entire image recording layer does not remain and there is no practical problem;

D: between C and E;

E: the image recording layer remains within a tolerable level;

F: between E and G; and

G: a significant portion of the image recording layer remains in a spot shape, which causes a practical problem.

TABLE 1

| No. | Large wave forming method | Amount of material removed by first etching ($g/m^2$) | First electrolysis; nitric acid electrolysis ($C/dm^2$) | Amount of material removed by second etching ($g/m^2$) | Second electrolysis; hydrochloric acid electrolysis ($C/dm^2$) | Amount of material removed by third etching ($g/m^2$) | Weight of recording layer ($g/m^2$) | Physical properties: Ra (μM) | Physical properties: Number of recesses per 400 μm square region | Physical properties: AFM specific surface area ΔS (%) |
|---|---|---|---|---|---|---|---|---|---|---|
| Ex. 1 | Brush graining | 10 | 220 | 0.2 | 50 | 0.05 | 1.3 | 0.4 | 0.7 | 75 |
| Ex. 2 | Brush graining | 10 | 220 | 0.2 | 50 | 0.05 | 1.3 | 0.36 | 0.6 | 70 |
| Ex. 3 | Brush graining | 10 | 220 | 0.2 | 50 | 0.05 | 1.3 | 0.42 | 0.8 | 78 |

TABLE 1-continued

| No. | Large wave forming method | Amount of material removed by first etching ($g/m^2$) | First electrolysis; nitric acid electrolysis ($C/dm^2$) | Amount of material removed by second etching ($g/m^2$) | Second electrolysis; hydrochloric acid electrolysis ($C/dm^2$) | Amount of material removed by third etching ($g/m^2$) | Weight of recording layer ($g/m^2$) | Physical properties Ra (μM) | Number of recesses per 400 μm square region | AFM specific surface area ΔS (%) |
|---|---|---|---|---|---|---|---|---|---|---|
| Ex. 4 | Brush graining | 10 | 220 | 0.2 | 50 | 0.05 | 1.3 | 0.45 | 1.3 | 82 |
| Ex. 5 | Brush graining | 10 | 220 | 0.2 | 50 | 0.05 | 1.3 | 0.5 | 2.7 | 79 |
| Ex. 6 | Brush graining | 10 | 220 | 0.2 | 50 | 0.01 | 1.3 | 0.4 | 0.8 | 88 |
| Ex. 7 | Brush graining | 10 | 220 | 0.2 | 50 | 0.03 | 1.3 | 0.4 | 1.1 | 53 |
| Ex. 7 | Brush graining | 10 | 220 | 0.2 | 50 | 0.06 | 1.3 | 0.4 | 1.1 | 53 |
| Ex. 7 | Brush graining | 10 | 220 | 0.2 | 50 | 0.08 | 1.3 | 0.4 | 1.1 | 53 |
| Ex. 8 | Brush graining | 10 | 220 | 0.2 | 50 | 0.05 | 1.1 | 0.4 | 1.5 | 75 |
| Ex. 9 | Brush graining | 10 | 220 | 0.2 | 50 | 0.05 | 1.2 | 0.4 | 0.8 | 75 |
| Ex. 10 | Brush graining | 10 | 220 | 0.2 | 50 | 0.05 | 1.4 | 0.4 | 0.7 | 75 |
| Ex. 11 | Brush graining | 10 | 220 | 0.2 | 50 | 0.05 | 1.5 | 0.4 | 0.6 | 75 |
| Ex. 12 | Brush graining | 10 | 220 | 0.2 | 50 | 0.05 | 1.0 | 0.4 | 0.6 | 75 |
| Ex. 13 | Brush graining | 10 | 220 | 0.2 | 50 | 0.05 | 1.8 | 0.4 | 0.6 | 75 |
| Ex. 14 | Graining through transfer | 10 | 220 | 0.2 | 50 | 0.05 | 1.3 | 0.4 | 0.2 | 70 |
| Ex. 15 | Hydrochloric acid electrolysis | 10 | 220 | 0.2 | 50 | 0.05 | 1.3 | 0.4 | 0.4 | 68 |
| CEx. 1 | — | 10 | 220 | 0.2 | 50 | 0.05 | 1.3 | 0.27 | 0.2 | 67 |
| CEx. 2 | Brush graining | 10 | 220 | 0.2 | 50 | 0.05 | 1.3 | 0.34 | 0.3 | 70 |
| CEx. 3 | Brush graining | 10 | 220 | 0.2 | 50 | 0.05 | 1.3 | 0.52 | 3.1 | 75 |
| CEx. 4 | Brush graining | 10 | 220 | 0.2 | 50 | 0.1 | 1.3 | 0.4 | 0.6 | 48 |
| CEx. 5 | Brush graining | 10 | 220 | 0.2 | 50 | 0.2 | 1.3 | 0.4 | 0.8 | 41 |

TABLE 2

| No. | Printing performance Press life (10,000's of units) | Scumming resistance | Scratch resistance | Sensitivity |
|---|---|---|---|---|
| Ex. 1 | 5.7 | C | C | C |
| Ex. 2 | 6.0 | B | D | B |
| Ex. 3 | 5.2 | C | B | C |
| Ex. 4 | 4.7 | C | A | C |
| Ex. 5 | 4.0 | D | A | D |
| Ex. 6 | 6.4 | C | C | D |
| Ex. 7 | 6.0 | C | C | C |
| Ex. 7 | 5.2 | C | C | C |
| Ex. 7 | 4.3 | C | C | C |
| Ex. 8 | 4.5 | C | C | A |
| Ex. 9 | 5.2 | C | C | A |
| Ex. 10 | 5.9 | C | C | C |
| Ex. 11 | 6.2 | C | C | D |
| Ex. 12 | 4.0 | C | C | A |
| Ex. 13 | 6.5 | C | C | E |
| Ex. 14 | 5.3 | B | C | A |
| Ex. 15 | 5.1 | B | C | A |
| CEx. 1 | 6.3 | B | G | A |

TABLE 2-continued

| No. | Printing performance Press life (10,000's of units) | Scumming resistance | Scratch resistance | Sensitivity |
|---|---|---|---|---|
| CEx. 2 | 5.9 | C | F | A |
| CEx. 3 | 3.8 | D | A | G |
| CEx. 4 | 3.7 | C | C | C |
| CEx. 5 | 3.2 | C | C | C |

What is claimed is:

1. A method of manufacturing a lithographic printing plate support comprising a surface which has:

an arithmetic mean roughness $R_a$ of 0.40 to 0.50 μm;

not more than 1.5 recesses with a depth of at least 4 μm per 400 μm square region; and a surface area ratio $\Delta S^{5(0.02\text{-}0.2)}$ defined by formula (1):

$$\Delta S^{5(0.02\text{-}0.2)}(\%)=[(S_x^{5(0.02\text{-}0.2)}-S_0)/S_0]\times100(\%) \quad (1)$$

wherein $S_x^{5(0.02\text{-}0.2)}$ is the actual surface area of a 5 μm square surface region as determined by three-point approximation based on data obtained by extracting 0.02 to 0.2 μm wavelength components from three-dimensional data on the surface region measured with an atomic force microscope at 512×512 points and $S_0$ is the geometrically measured surface area of the surface region, of 70 to 82%, said method comprising:

subjecting an aluminum plate at least to a first electrochemical graining treatment in a nitric acid-containing aqueous solution and a second electrochemical graining treatment in a hydrochloric acid-containing aqueous solution; and bringing the aluminum plate having undergone the first and second electrochemical graining treatments into contact with an alkaline aqueous solution to carry out alkaline etching treatment until the amount of a material removed by the alkaline etching treatment reaches 0.01 to 0.08 $g/m^2$.

2. A method of manufacturing a lithographic printing plate support according to claim 1 comprising the step of carrying out mechanical graining treatment by scrubbing an aluminum plate with rotating brushes while an abrasive having a mean particle size of 5 to 40 μm and containing at least 60 wt % of $SiO_2$ is supplied to the aluminum plate.

3. The lithographic printing plate support produced by the method according to claim 1.

4. A presensitized plate comprising:

the lithographic printing plate support according to claim 3; and a recording layer formed on the lithographic printing plate support and having a weight per unit area of 1.1 to 1.6 $g/m^2$.

5. The method of claim 1, wherein the etching and a surface area increase rate maximize a small wave characteristic of the surface area.

* * * * *